United States Patent
Hsiung et al.

(10) Patent No.: US 12,183,633 B2
(45) Date of Patent: Dec. 31, 2024

(54) DIELECTRIC CAP STRUCTURE IN SEMICONDUCTOR DEVICES AND METHODS OF MANUFACTURING THE SAME

(71) Applicant: Taiwan Semiconductor Manufacturing Company, Ltd., Hsinchu (TW)

(72) Inventors: Te-Chih Hsiung, Taipei (TW); Yi-Chen Wang, Hsinchu (TW); Guang-Hong Cheng, Hsinchu (TW); Wen Wang, Hsinchu (TW); Yuan-Tien Tu, Puzih (TW); Huan-Just Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 503 days.

(21) Appl. No.: 17/533,895

(22) Filed: Nov. 23, 2021

(65) Prior Publication Data
US 2022/0344206 A1 Oct. 27, 2022

Related U.S. Application Data

(60) Provisional application No. 63/178,806, filed on Apr. 23, 2021.

(51) Int. Cl.
| | |
|---|---|
| *H01L 21/768* | (2006.01) |
| *H01L 23/522* | (2006.01) |
| *H01L 23/532* | (2006.01) |
| *H01L 29/423* | (2006.01) |
| *H01L 29/78* | (2006.01) |
| *H01L 29/786* | (2006.01) |

(52) U.S. Cl.
CPC .. *H01L 21/76897* (2013.01); *H01L 23/53295* (2013.01); *H01L 23/5226* (2013.01); *H01L 29/42392* (2013.01); *H01L 29/7851* (2013.01); *H01L 29/78696* (2013.01)

(58) Field of Classification Search
CPC ......... H01L 21/76897; H01L 23/53295; H01L 23/5226; H01L 29/42392; H01L 29/7851; H01L 29/78696; H01L 21/823475; H01L 27/088; H01L 29/0653; H01L 29/41725; H01L 29/66795
See application file for complete search history.

(56) References Cited

U.S. PATENT DOCUMENTS

2022/0302310 A1* 9/2022 Choi .................. H01L 29/7851

* cited by examiner

*Primary Examiner* — Changhyun Yi
(74) *Attorney, Agent, or Firm* — FOLEY & LARDNER LLP

(57) ABSTRACT

A semiconductor device includes a channel structure, a first gate structure straddling the channel structure, and an epitaxial structure. The epitaxial structure is adjacent to the first gate structure and is coupled to an end of the channel structure. The semiconductor device further includes a first contact structure disposed over and in contact with the epitaxial structure and a nitride-based conformal layer extending at least over the first contact structure. The semiconductor device further includes an oxide-based layer disposed over the nitride-based conformal layer. A portion of the nitride-based conformal layer, disposed over the first contact structure, has a dip that is filled with a first portion of the oxide-based layer.

20 Claims, 22 Drawing Sheets

DIELECTRIC CAP STRUCTURE IN SEMICONDUCTOR DEVICES AND METHODS OF MANUFACTURING THE SAME

CROSS-REFERENCE TO RELATED APPLICATION

This application claims priority to and the benefit of U.S. Provisional Application No. 63/178,806, filed Apr. 23, 2021, entitled "LOW RC AND DEVICE BOOST FOR VG ETCH," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
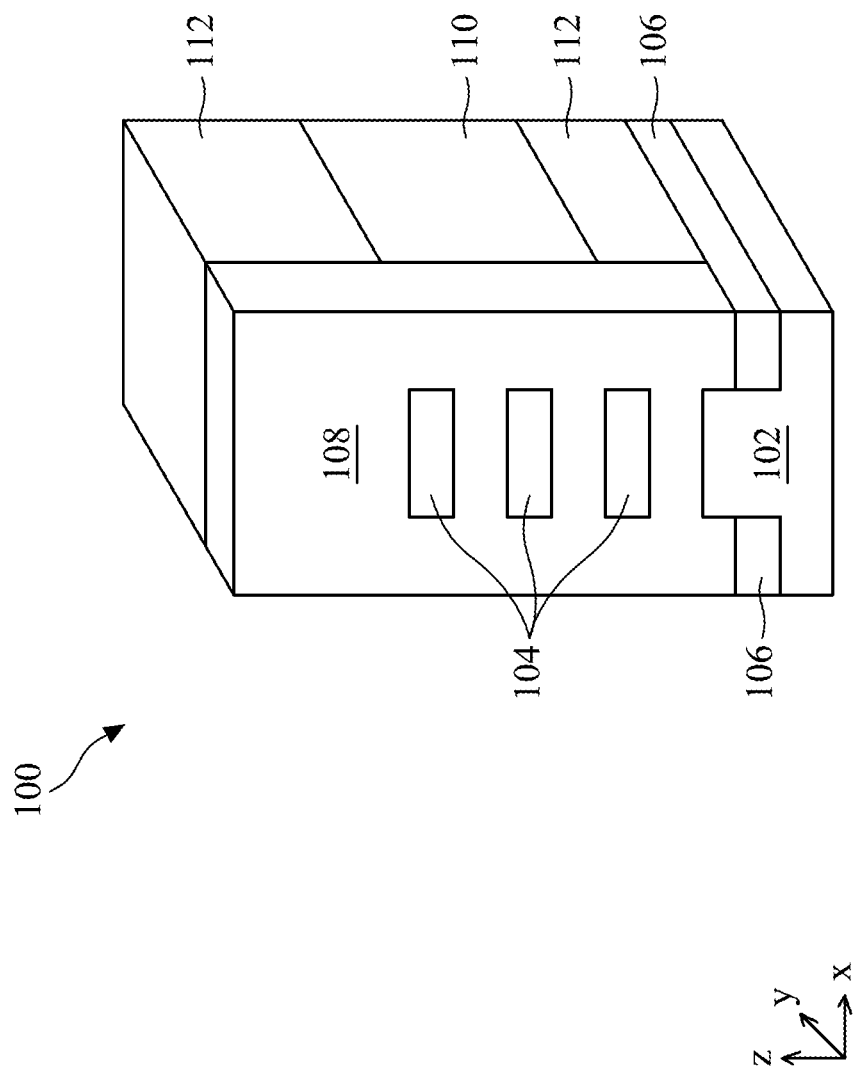
FIG. 1 illustrates a perspective view of a nanostructure field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

100.111 In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures such as nanostructure transistors (e.g., nanosheet transistors, nanowire transistors, gate_all_around (GAA) transistor, multi bridge channel (MBC) transistor, etc.) can further increase device performance. The nanostructure transistor, in general, includes a gate structure that wraps around the perimeter of one or more nanostructures for improved control of channel current flow.

The present disclosure provides various embodiments of a non-planar transistor device that includes a nitride-based conformal layer disposed over one or more gate structures and one or more contact structures coupled to epitaxial source/drain structures, as those structures are formed. By forming such a nitride-based layer, the source/drain contact structure can be protected from being damaged when forming a contact structure for the gate structure. For example, to form a gate contact structure, a recess is typically formed by etching through an oxide-based layer (e.g., an interlayer dielectric (ILD)), followed by filling the recess with a metal material. With the nitride-based layer covering the source/drain structure (e.g., interposed between the ILD and the source/drain contact structure), an etch selectivity is present when forming the recess for a gate contact structure. As such, the recess can be accurately controlled and formed, while minimizing the damage to the source/drain contact structure (e.g., under a misalignment scenario). Accordingly, leakage from the source/drain structure (or its contact structure) can be advantageously minimized. Further, the nitride-based layer is formed as a relatively thin conformal layer when compared to the relatively thick etch stop layer (e.g., formed of silicon nitride), that almost fully overlays the gate structure. Because of the relatively thin thickness, an oxide-based cap layer can then overlay the gate structure prior to forming the ILD. As such, a parasitic delay (e.g., an RC delay), if any, that is associated with the gate contact structure/gate structure can be significantly reduced, as the disclosed oxide-based cap layer is typically characterized with a smaller dielectric constant than the silicon nitride etch stop layer.

FIG. 1 illustrates a perspective view of a non-planar transistor device 100, in accordance with various embodiments. In accordance with some embodiments, the non-planar device 100 includes a nanostructure FET device (hereinafter "nanostructure FET device 100"). However, it should be understood that the device 100 can include any of various other types of transistor configurations, while remaining within the scope of present disclosure.

The nanostructure FET device 100 includes a substrate 102 and a number of semiconductor layers 104 that may contain nanostructures (e.g., nanosheets, nanowires, etc.) above the substrate 102. The semiconductor layers 104 (which may sometimes be collectively referred to as a channel structure) are vertically separated from one another. Isolation structure 106 are formed on opposing ends of a protruded portion of the substrate 102 with the semiconductor layers 104 disposed above the protruded portion. A gate structure 108 wraps around each of the semiconductor layers 104 (e.g., a full perimeter of each of the semiconductor layers 104). Epitaxial structures 110 which may include source and drain regions are disposed on opposing sides of the gate structure 108. An interlayer dielectric (ILD) 112 is disposed over the epitaxial structure 110. FIG. 1 depicts a simplified nanostructure FET device, and thus, it should be understood that one or more features of a completed nanostructure FET device may not be shown in FIG. 1. For example, the other epitaxial structure opposite the gate structure 108 from the epitaxial structure 110 and the ILD disposed over such an epitaxial structure are not shown in FIG. 1.

Figure 2A:
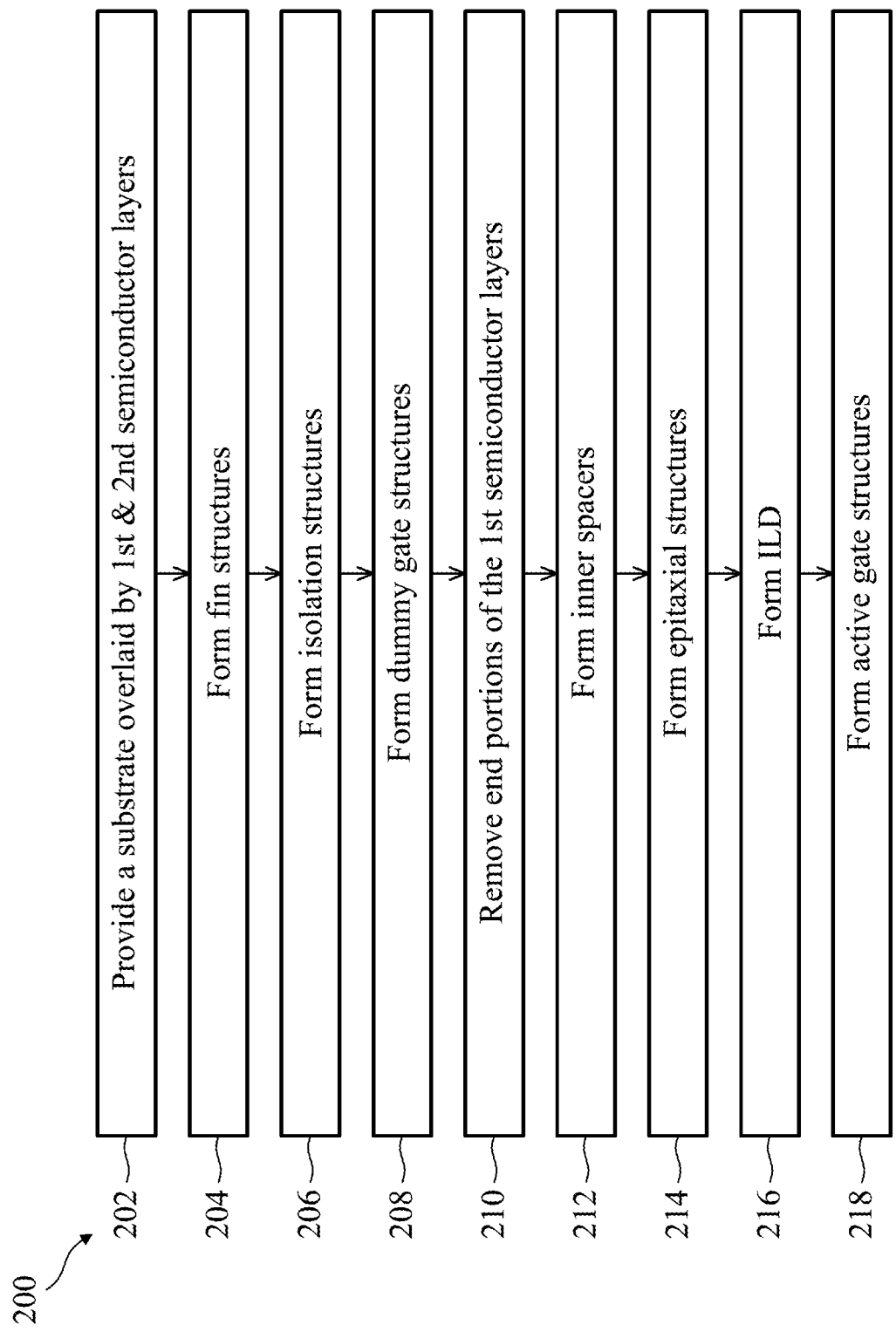
FIGS. 2A-B illustrates a flow chart of an example method for making a non-planar transistor device, in accordance with some embodiments.
Figure 2B:
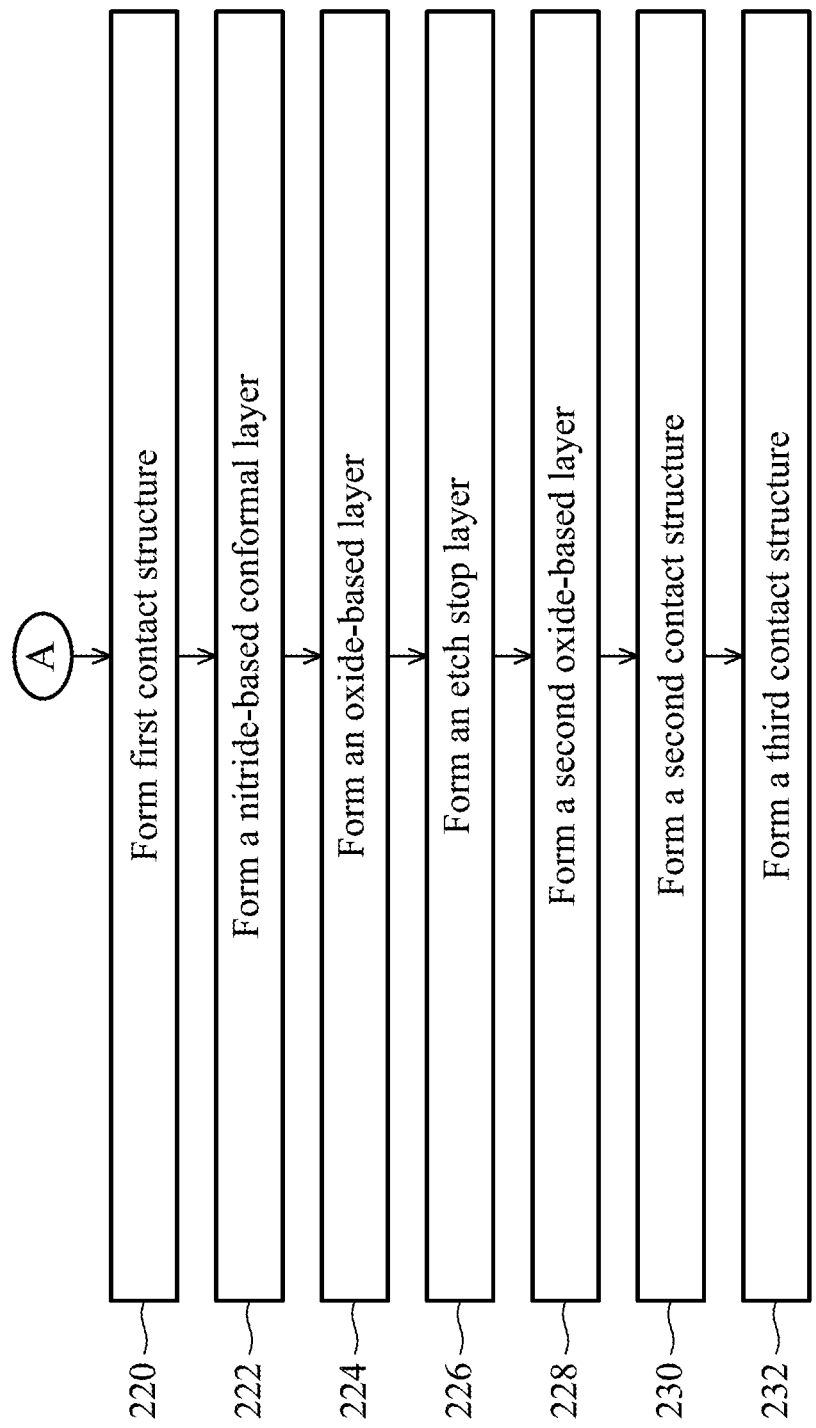

FIG. 2 illustrates a flowchart of a method 200 to form a non-planar transistor device, according to one or more embodiments of the present disclosure. For example, at least some of the operations (or steps) of the method 200 can be used to form a nanostructure transistor device such as, for example, a nanostructure FET device, a nanosheet transistor device, a nanowire transistor device, a vertical transistor device, or the like. Further, the method 200 can be used to form a nanostructure transistor device in a respective conduction type such as, for example an n-type nanostructure transistor device or a p-type nanostructure transistor device. The term "n-type," as used herein, may be referred to as the conduction type of a transistor having electrons as its conduction carriers; and the term "p-type," as used herein, may be referred to as the conduction type of a transistor having holes as its conduction carriers.

It is noted that the method 200 is merely an example, and is not intended to limit the present disclosure. Accordingly, it is understood that additional operations may be provided before, during, and after the method 200 of FIG. 2, and that some other operations may only be briefly described herein. In various embodiments, operations of the method 200 may be associated with cross-sectional views of an example nanostructure transistor device at various fabrication stages as shown in FIGS. 3, 4, 5, 6, 7, 8A, 8B, 9, 10, 11A, 12, 13, 14, 15A and 16A, respectively. For purposes of clarity of illustration, FIGS. 11B, 15B, and 16B illustrate perspective views of the example nanostructure transistor device corresponding to FIGS. 11A, 15A, and 16A, respectively.

In a brief overview, the method 200 starts operation 202 of providing a substrate overlaid by a number of first semiconductor layers and a number of second semiconductor layers. The method 200 continues to operation 204 in which fin structures are formed. The method 200 continues to operation 204 in which isolation structures are formed. The method 200 continues to operation 208 in which dummy gate structures are formed. The method 200 continues to operation 210 in which end portions of the first semiconductor layers are removed. The method 200 continues to operation 212 in which inner spacers are formed. The method 200 continues to operation 214 in epitaxial structures are formed. The method 200 continues to operation 216 in which an interlayer dielectric (ILD) is formed. The method 200 continues to operation 218 in which active gate structures are formed.

The method 200 continues to operation 220 in which a first contact structure is formed. The method 200 continues to operation 222 in which a nitride-based conformal layer is formed.

The method 200 continues to operation 224 in which an oxide-based layer is formed. The method 200 continues to operation 226 in which an etch stop layer is formed. The method 200 continues to operation 228 in which a second oxide-based layer is formed. The method 200 continues to operation 230 in which a second contact structure is formed. The method 200 continues to operation 232 in which a third contact structure is formed.

Figure 4:
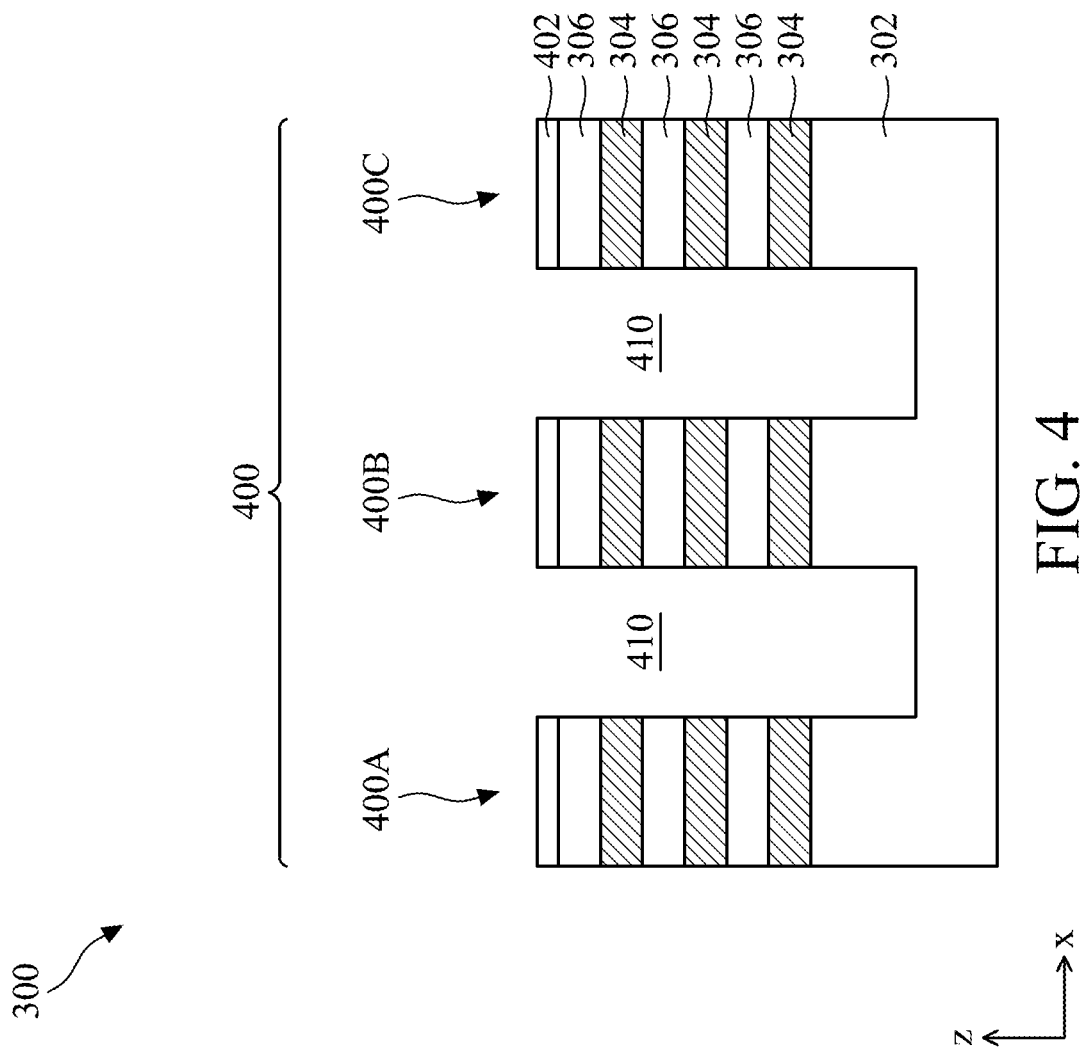
Figure 5:
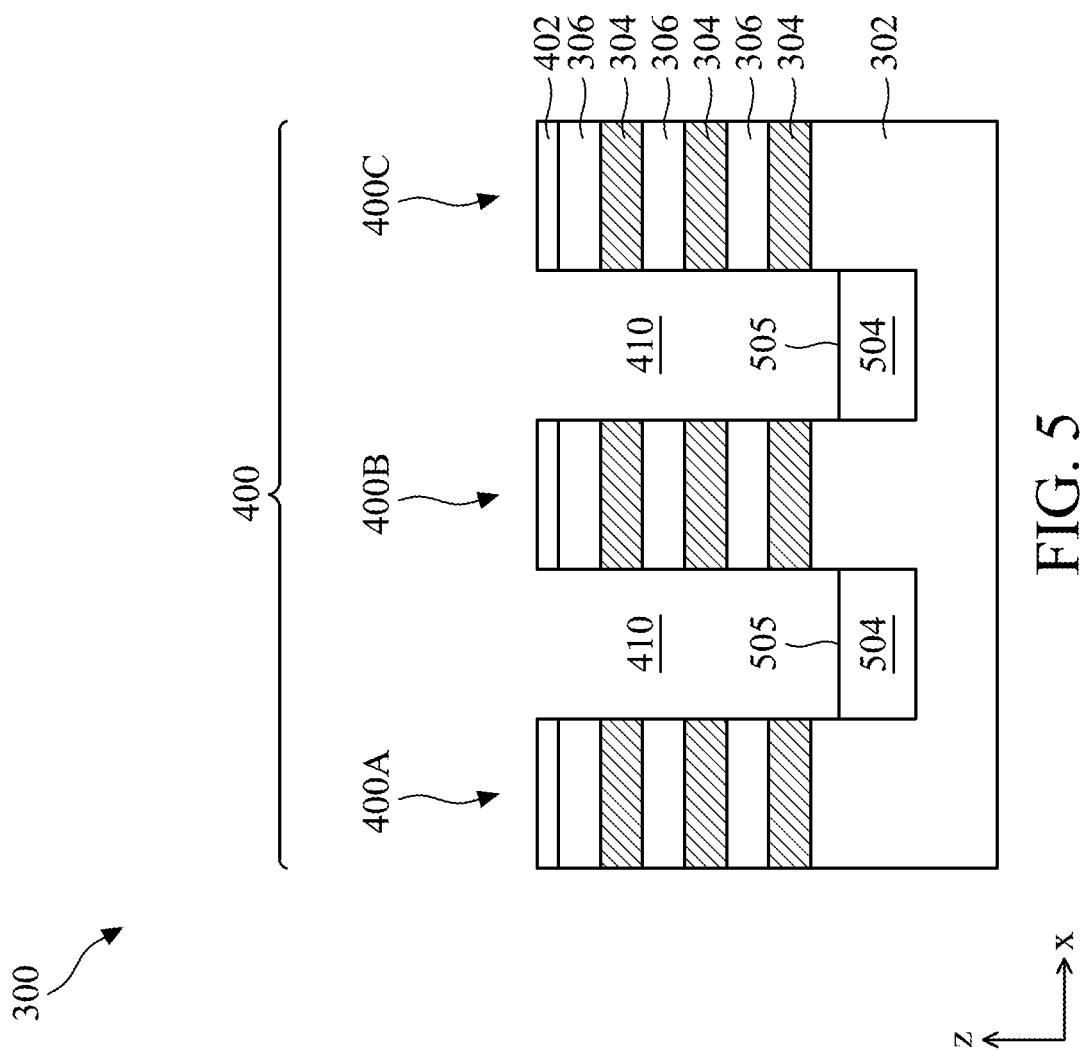

As mentioned before, FIGS. 3-16B each illustrate, in either a cross-sectional or perspective view, a portion of a nanostructure transistor device 300, either in n-type or p-type, at various fabrication stages of the method 200 of FIG. 2. For example, FIGS. 3, 6-10A, 11A, 12-15A, and 16A illustrate cross-sectional views of the nanostructure transistor device 300 along the Y-direction which corresponds to a cross-section cut along the latitudinal direction of a gate trench or an active gate structure. FIGS. 4-5 illustrate cross-sectional views of the nanostructure transistor device 300 along the X-direction which corresponds to a cross-section cut along the longitudinal direction of the gate trench or the active gate structure. FIGS. 11B, 15B, and 16B illustrate perspective views of the nanostructure transistor device 300 that correspond to FIGS. 11A, 15A, and 16A, respectively. Although FIGS. 2-16B illustrate the nanostructure transistor device 300, it is understood the nanostructure transistor device 300 may include a number of other devices such as inductors, fuses, capacitors, coils, etc., which are not shown in FIGS. 2-16B, for purposes of clarity of illustration.

Figure 3:
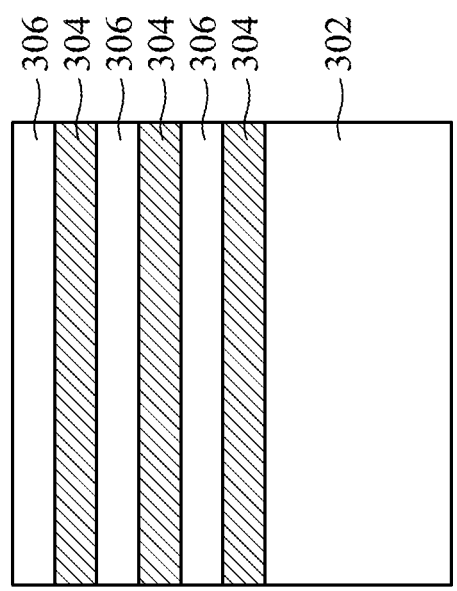
FIGS. 3, 4, 5, 6, 7, 8A, 8B, 9, 10, 11A, 12, 13, 14, 15A and 16A illustrate cross-sectional views of an example nanostructure transistor device (or a portion of the example nanostructure transistor device) during various fabrication stages, made by the method of FIG. 2A-B, in accordance with some embodiments.

Corresponding to operation 202 of FIG. 2, FIG. 3 is a cross-sectional view of the nanostructure transistor device 300 including a number of first semiconductor layers 304 and a number of second semiconductor layers 306 formed on a semiconductor substrate 302 at one of the various stages of fabrication. As shown in the illustrated example of FIG. 3, the semiconductor layers 304 and 306 are formed as a stack over the semiconductor substrate 302.

The semiconductor substrate 302 includes a semiconductor material substrate, for example, silicon. Alternatively, the semiconductor substrate 302 may include other elementary semiconductor material such as, for example, germanium. The semiconductor substrate 302 may also include a compound semiconductor such as silicon carbide, gallium arsenic, indium arsenide, and indium phosphide. The semiconductor substrate 302 may include an alloy semiconductor such as silicon germanium, silicon germanium carbide, gallium arsenic phosphide, and gallium indium phosphide. In one embodiment, the semiconductor substrate 302 includes an epitaxial layer. For example, the semiconductor substrate 302 may have an epitaxial layer overlying a bulk semiconductor. Furthermore, the semiconductor substrate 302 may include a semiconductor-on-insulator (SOI) structure. For example, the semiconductor substrate 302 may include a buried oxide (BOX) layer formed by a process such as separation by implanted oxygen (SIMOX) or other suitable technique, such as wafer bonding and grinding.

The first semiconductor layers 304 and the second semiconductor layers 306 are alternatingly disposed on top of one another (e.g., along the Z direction) to form a stack. For example, one of the second semiconductor layers 306 is disposed over one of the first semiconductor layers 304 then another one of the first semiconductor layers 304 is disposed over the second semiconductor layer 306, so on and so forth.

The stack may include any number of alternately disposed semiconductor layers 304 and 306. The semiconductor layers 304 and 306 may have different thicknesses. The first semiconductor layers 304 may have different thicknesses from one layer to another layer. The second semiconductor layers 306 may have different thicknesses from one layer to another layer. The thickness of each of the semiconductor layers 304 and 306 may range from few nanometers to few tens of nanometers. The first layer of the stack may be thicker than other semiconductor layers 304 and 306. In an embodiment, each of the first semiconductor layers 304 has a thickness ranging from about 5 nanometers (nm) to about 20 nm, and each of the second semiconductor layers 306 has a thickness ranging from about 5 nm to about 20 nm. Either the first semiconductor layer 304 or the second semiconductor layer 306 may be the topmost layer (or the layer most distanced from the semiconductor substrate 302). Either the first semiconductor layer 304 or the second semiconductor layer 306 may be the bottommost layer (or the layer most proximate to the semiconductor substrate 302).

The two semiconductor layers 304 and 306 have different compositions. In various embodiments, the two semiconductor layers 304 and 306 have compositions that provide for different oxidation rates and/or different etch selectivity between the layers. In an embodiment, the first semiconductor layers 304 include silicon germanium ($Si_{1-x}Ge_x$), and the second semiconductor layers 306 include silicon (Si). In an embodiment, each of the second semiconductor layers 306 is silicon that may be undoped or substantially dopant-free (i.e., having an extrinsic dopant concentration from about $0$ $cm^{-3}$ to about $1\times10^{17}$ $cm^{-3}$), where for example, no intentional doping is performed when forming the layers 306 (e.g., of silicon).

In various embodiments, the second semiconductor layers 306 may be intentionally doped. For example, when the nanostructure transistor device 300 is configured in n-type (and operates in an enhancement mode), each of the second semiconductor layers 306 may be silicon that is doped with a p- type dopant such as boron (B), aluminum (Al), indium (In), and gallium (Ga); and when the nanostructure transistor device 300 is configured in p-type (and operates in an enhancement mode), each of the second semiconductor layers 306 may be silicon that is doped with an n-type dopant such as phosphorus (P), arsenic (As), antimony (Sb). In another example, when the nanostructure transistor device 300 is configured in n-type (and operates in a depletion mode), each of the second semiconductor layers 306 may be silicon that is doped with an n-type dopant instead; and when the nanostructure transistor device 300 is configured in p-type (and operates in a depletion mode), each of the semiconductor layers 306 may be silicon that is doped with a p-type dopant instead. In some embodiments, each of the first semiconductor layers 304 is $Si_{1-x}Ge_x$ that includes less than 50% (x<0.5) Ge in molar ratio. For example, Ge may comprise about 15% to 35% of the semiconductor layers 328 of $Si_{1-x}Ge_x$ in molar ratio. Furthermore, the first semiconductor layers 304 may include different compositions among them, and the second semiconductor layers 306 may include different compositions among them.

Either of the semiconductor layers 304 and 306 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, any other suitable material, or combinations thereof. The materials of the semiconductor layers 304 and 306 may be chosen based on providing differing oxidation rates and/or etch selectivity.

The semiconductor layers 304 and 306 can be grown from the semiconductor substrate 302. For example, each of the semiconductor layers 304 and 306 may be grown by a molecular beam epitaxy (MBE) process, a chemical vapor deposition (CVD) process such as a metal organic CVD (MOCVD) process, and/or other suitable growth processes. During the epitaxial growth, the crystal structure of the semiconductor substrate 302 extends upwardly, resulting in the semiconductor layers 304 and 306 having the same crystal orientation with the semiconductor substrate 302. The semiconductor layers 304 and 306 continuously extend along the X-direction.

Corresponding to operation 204 of FIG. 2, FIG. 4 is a cross-sectional view of the nanostructure transistor device 300 along the X-direction including a number of fin structures 400A, 400B, and 400C (which may sometimes be referred to as fin structures 400) at one of the various stages of fabrication. Each of the fin structures 400, which is elongated along the Y-direction, can include a stack of semiconductor layers 304-306 alternatively stacked with each other. Although three fin structures are shown in the illustrated embodiment of FIG. 4 (and the following figures), it should be appreciated that the nanostructure transistor device 300 can include any number of fin structures while remaining within the scope of the present disclosure.

The fin structures 400 are formed by patterning the semiconductor layers 304-306 and the semiconductor substrate 302 using, for example, photolithography and etching techniques. For example, a mask layer (which can include multiple layers such as, for example, a pad oxide layer and an overlying pad nitride layer) is formed over the topmost semiconductor layer 306 (FIG. 3). The pad oxide layer may be a thin film comprising silicon oxide formed, for example, using a thermal oxidation process. The pad oxide layer may act as an adhesion layer between the topmost semiconductor layer 306 (or the semiconductor layer 304 in some other embodiments) and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask 402, as illustrated in FIG. 4.

The patterned mask 402 is subsequently used to pattern exposed portions of the semiconductor layers 304-306 and the substrate 302 to form trenches (or openings) 410, thereby defining the fin structures 400 between adjacent trenches 410, as illustrated in FIG. 4. The trenches 410 continuously extend along the Y-direction. When multiple fin structures are formed, such a trench may be disposed between any adjacent ones of the fin structures. In some embodiments, the fin structures 400 are formed by etching trenches in the semiconductor layers 304-306 and the substrate 302 using, for example, reactive ion etch (ME), neutral beam etch (NBE), the like, any other suitable process, or combinations thereof. The etch may be anisotropic. In some embodiments, the trenches 410 may be strips (when viewed from the top) parallel to each other, and closely spaced with respect to each other. In some embodiments, the trenches 410 may be continuous and surround the fin structures 400.

Corresponding to operation 206 of FIG. 2, FIG. 5 is a cross-sectional view cut along the X-direction of the nanostructure transistor device 300 including isolation structures 504 (sometimes referred to as isolation regions) at one of the various stages of fabrication. As shown in FIG. 5, each of the isolation structures 504 can be disposed between adjacent ones of the fin structures 400, and partially embed respective lower portions of the adjacent fin structures 400. The isolation structures 504, which are formed of an insulation material, can electrically isolate neighboring active structures (e.g., fin structures 400) from each other. The isolation structures 504 continuously extend in the Y-direction. The insulation material may be an oxide, such as silicon oxide, a nitride, the like, any other suitable material, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, any other suitable method, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process or any other suitable process, may remove any excess insulation material and form a top surface of the insulation material and a top surface of the patterned masks 402 that are coplanar (not shown). The patterned masks 402 may be removed by the planarization process, in some other embodiments Next, the insulation material is recessed to form the isolation structures 504, as shown in FIG. 5, which are sometimes referred to as shallow trench isolations (STIs). The isolation structures 504 are recessed such that the fin structures 400 protrude from between neighboring isolation structures 504. The isolation structures 504 may be recessed to where a top surface of the isolation structures 505 is below the substrate 302. Respective top surfaces of the isolation structures (STIs) 504 may have a flat surface (as illustrated), a convex surface, a concave surface (such as dishing), any other suitable surface, or combinations thereof. The top surfaces of the isolation structures 504 may be formed flat, convex, and/or concave by an appropriate etch. The isolation structures 504 may be recessed using an acceptable etching process, such as one that is selective to the material of the isolation structures 504. For example, a dry etch or a wet etch using dilute hydrofluoric (DHF) acid may be performed to recess the isolation structures 504.

Figure 6:
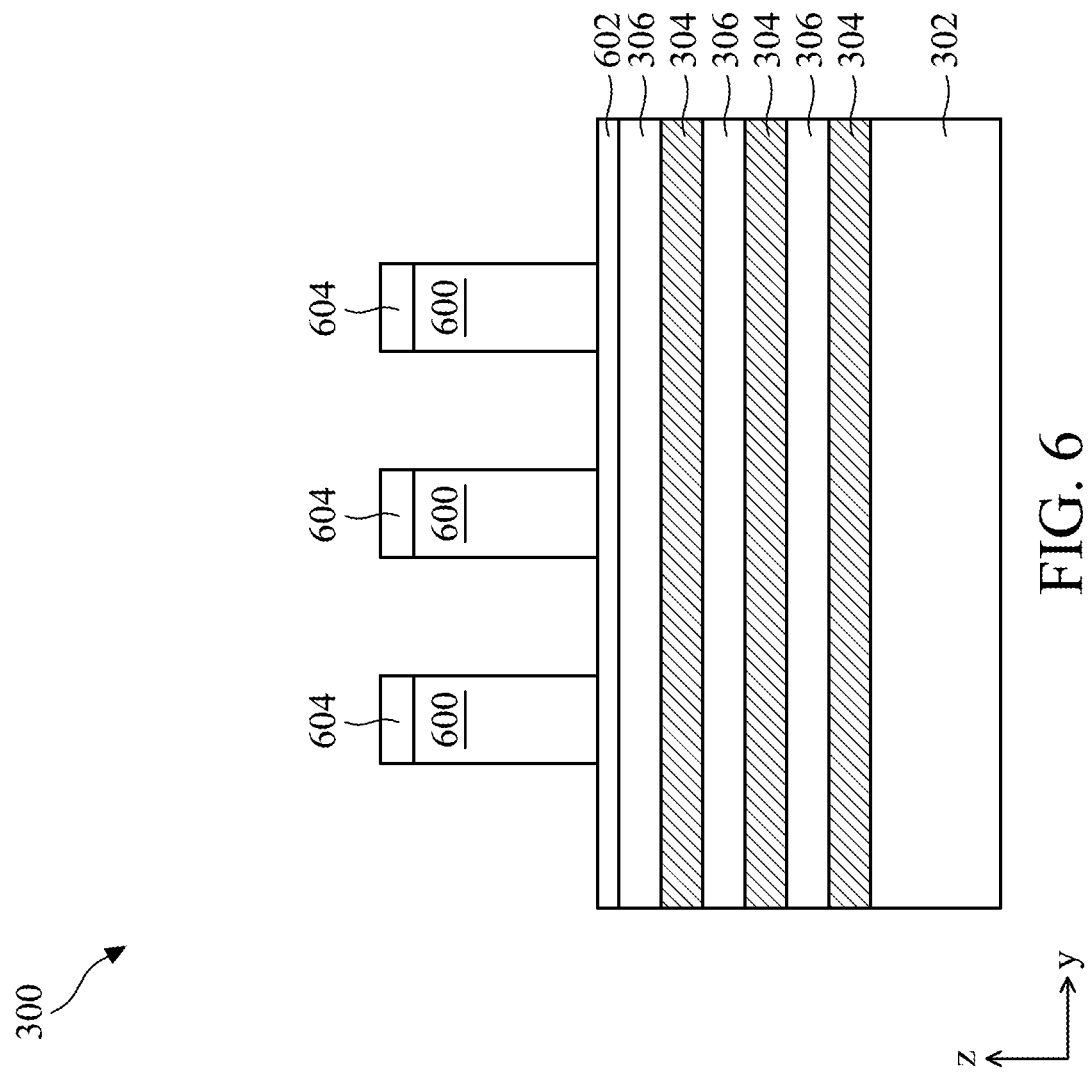

Corresponding to operation 208 of FIG. 2, FIG. 6 is a cross-sectional view cut along Y-direction of the nanostructure transistor device 300 including one or more dummy gates structures 600 at one of the various stages of fabrication. As shown in the illustrated example of FIG. 6, the dummy gate structures 600, continuously extending along the X-direction, can be formed over the workpiece. The dummy gate structures 600 are placed where an active (e.g., metal) gate structure may later be formed, in various embodiments. Three dummy gate structures 600 are shown in FIG. 6, but it is understood that any number of dummy gate structures 600 may be formed in a nanostructure transistor device.

An etching stop layer 602 may be formed over a substantially top surface shared by the fin structures 400. As used herein, the term "substantially planar" refers to a structures where the deviation of the structures from a plane is within the statistical atomic level variations inherent within semiconductor processing methods known in the art. The etching stop layer 602 may include silicon oxide or any other suitable material. The etching stop layer 602 may be formed by a deposition process, such as CVD (such as PECVD, HARP, or combinations thereof) process, ALD process, another applicable process, or a combination thereof.

Next, the dummy gate structures 600 are formed over the etching stop layer 602. The dummy gate structures 600 include a dummy gate dielectric (not shown) and a dummy gate (not shown), in some embodiments. A mask 604 may be formed over the dummy gate structure 600. To form the dummy gate structure 600, a dielectric layer is formed over the etch stop layer 602. The dielectric layer may be, for example, silicon oxide, silicon nitride, silicon oxynitride, silicon carbide, silicon carbonitride, silicon oxycarbonitride, silicon oxycarbide, multilayers thereof, or any other suitable material and may be deposited or thermally grown.

A gate layer is then formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 604. The pattern of the mask 604 then may be transferred to the gate layer and the dielectric layer by a suitable etching technique to form the dummy gate structures 600. The dummy gate structures 600 each cover a respective central portion (e.g., a channel region) of each of the fin structures 400.

Figure 7:
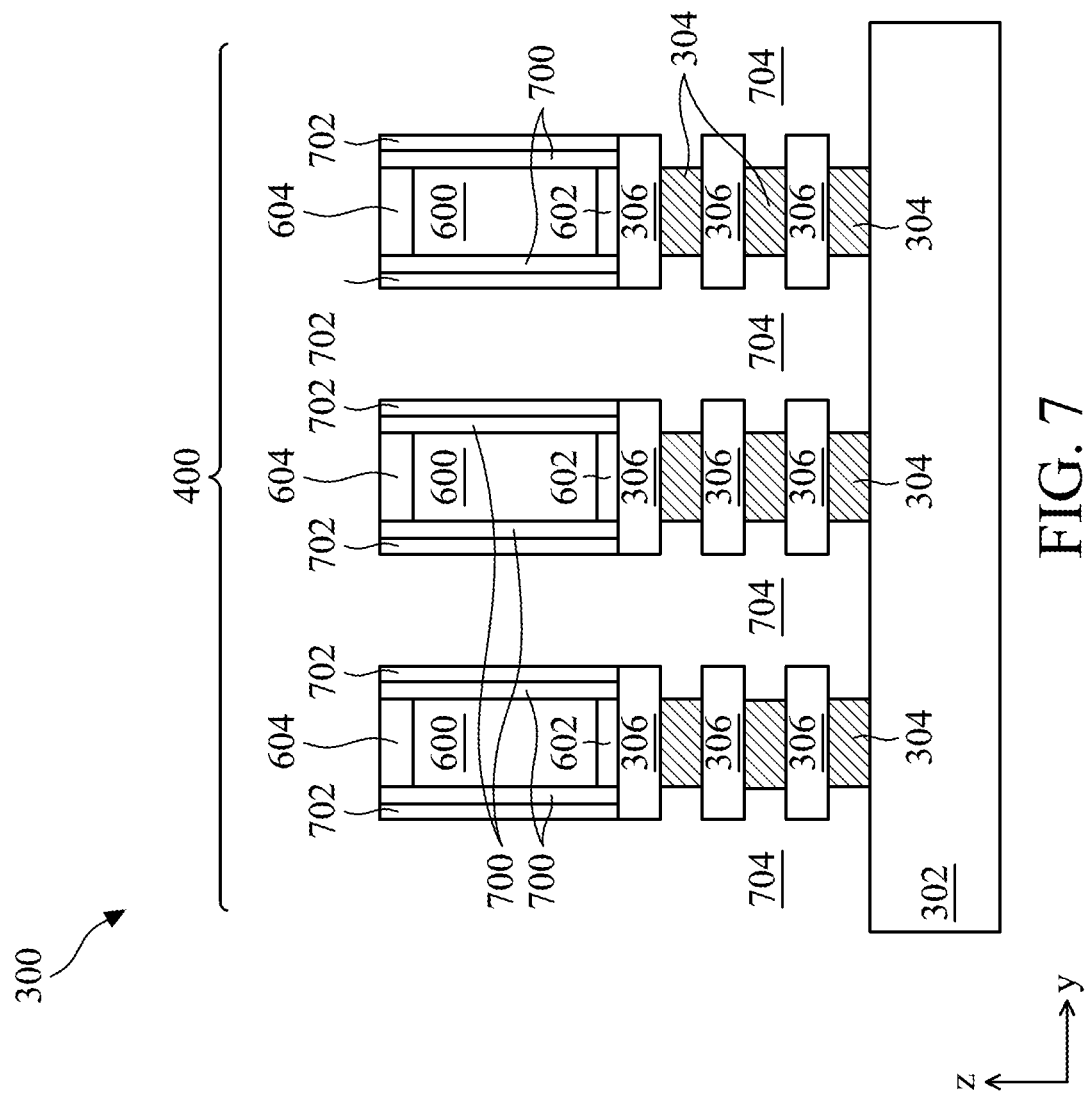

Corresponding to operation 210 of FIG. 2, FIG. 7 is a cross-sectional view cut along the Y-direction of the nanostructure transistor device 300 in which portions of the fin structures 400 (FIG. 4) not overlaid by the dummy structures 600 (and the corresponding first gate spacers 700) and end portions of the semiconductor layers 304 are removed at one of the various stages of fabrication.

After the formation of the dummy gate structures 600, the first gate spacers 700 may be formed on opposing sidewalls (and extend along the X-direction) of each of the dummy gate structures 600. The first gate spacers 700 may be low-k spacers and may be formed of a suitable dielectric material, such as silicon oxide, silicon oxycarbonitride, or the like. Any suitable deposition method, such as thermal oxidation, chemical vapor deposition (CVD), or the like, may be used to form the first gate spacers 700. In some embodiments, the first gate spacers 700 may have a thickness in the Y-direction in between about 1 nanometer and about 12 nanometers, inclusive (e.g., 1, 2, 5, 7, 10, 11, and 12 nanometers) or any other suitable thickness. The shapes and formation methods of the first gate spacers 700 as illustrated and described in FIG. 7 are merely non-limiting examples, and other shapes and formation methods are possible. These and other variations are fully intended to be included within the scope of the present disclosure.

In some embodiments, one or more second gate spacers 702 may be optionally formed on opposing sidewalls (and extend along the X-direction) of each of the first gate spacers 700. The second gate spacers 702 may be a low-k spacer and may be formed of a suitable dielectric material, such as SiO, SiN, SiOC, SiOCN, any other suitable material, or combinations thereof. In some embodiments, the second gate spacer 702 is nitride-based. Any suitable deposition method, such as thermal oxidation, chemical vapor deposition (CVD), or the like, may be used to form the second gate spacers 702. In some embodiments, the second gate spacers 702 may have a thickness in the Y-direction in between about 1 nanometer and about 12 nanometers, inclusive (e.g., 1, 2, 5, 7, 10, 11, and 12 nanometers) or any other suitable thickness. The second gate spacers 702 may be formed from the same or a different material from the first gate spacers 700. The shapes and formation methods of the second gate spacers 702 as illustrated and described in FIG. 7 are merely non-limiting examples, and other shapes and formation methods are possible. These and other variations are fully intended to be included within the scope of the present disclosure.

Next, the portions of the fin structures 400 that are not covered by the dummy gate structures 600 and the first gate spacers 700 are removed by, for example, an anisotropic etching process using the dummy gate structures 600 as an etching mask, although any other suitable etching process may also be used. Upon the portions of the fin structures 400 being removed, source/drain recesses 704 are formed. The source/drain recesses 704 can each expose respective "shortened" ends (along the Y direction) of each of the semiconductor layers 304 and 306.

Upon the ends of the semiconductor layers 304 and 306 being exposed (e.g., when forming the source/drain recesses 704), respective end portions of each of the first semiconductor layers 304 may be concurrently removed. The end portions of the first semiconductor layers 304 can be removed (e.g., etched) using a "pull-back" process to pull the first semiconductor layers 304 by an initial pull-back distance such that the ends of the first semiconductor layers 304 terminate underneath (e.g., aligned with) the gate spacers 700 and 702 (if present). It is understood that the pull-back distance (i.e., the extent to which each of the semiconductor layers 304 is etched, or pulled-back) can be arbitrarily increased or decreased. In an example where the semiconductor layers 306 include Si, and the semiconductor layers 304 include $Si_{1-x}Ge_x$, the pull-back process may include a hydrogen chloride (HCL) gas isotropic etch process, which etches SiGe without attacking Si. As such, the semiconductor layers 306 may remain substantially intact during this process.

Figure 8A:
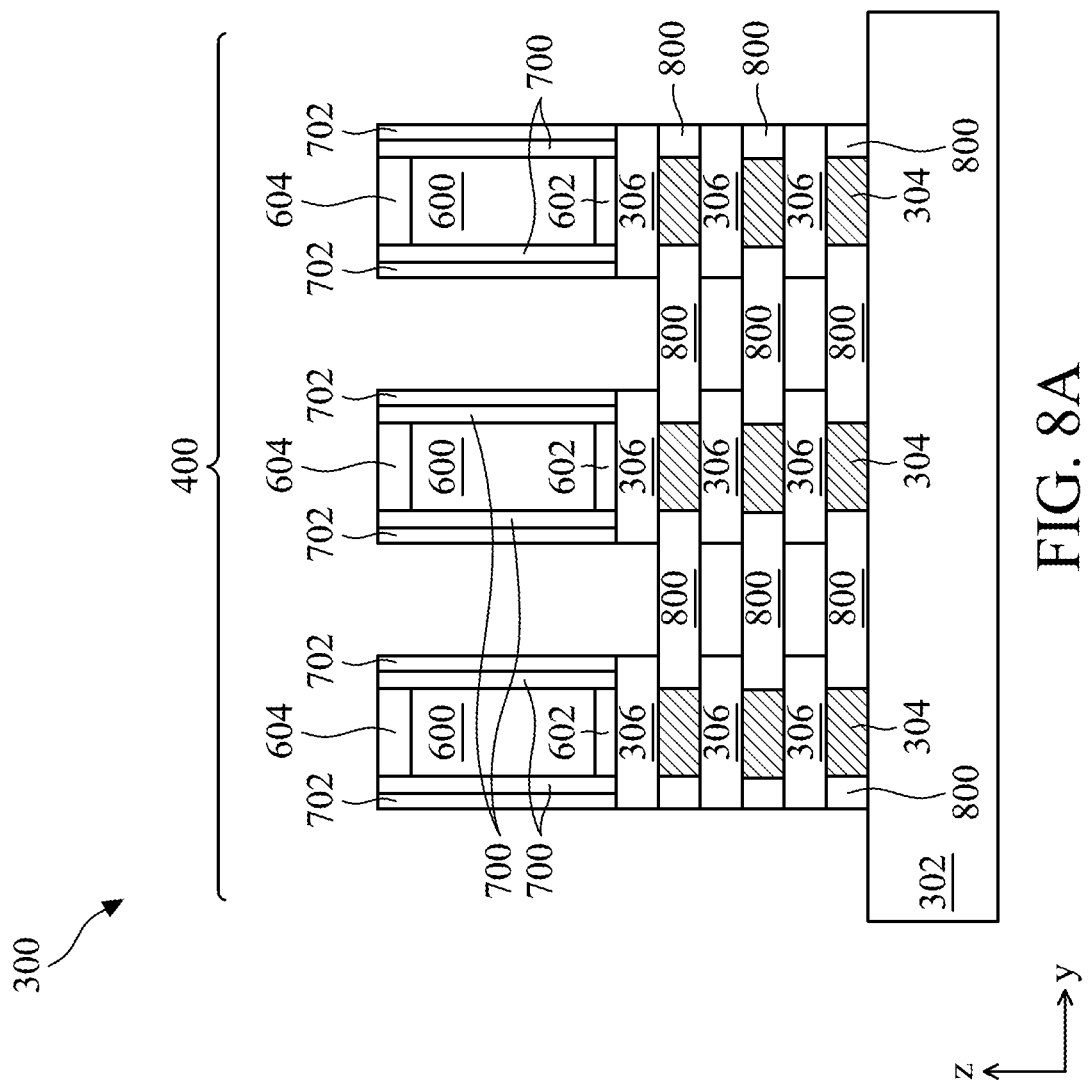
Figure 8B:
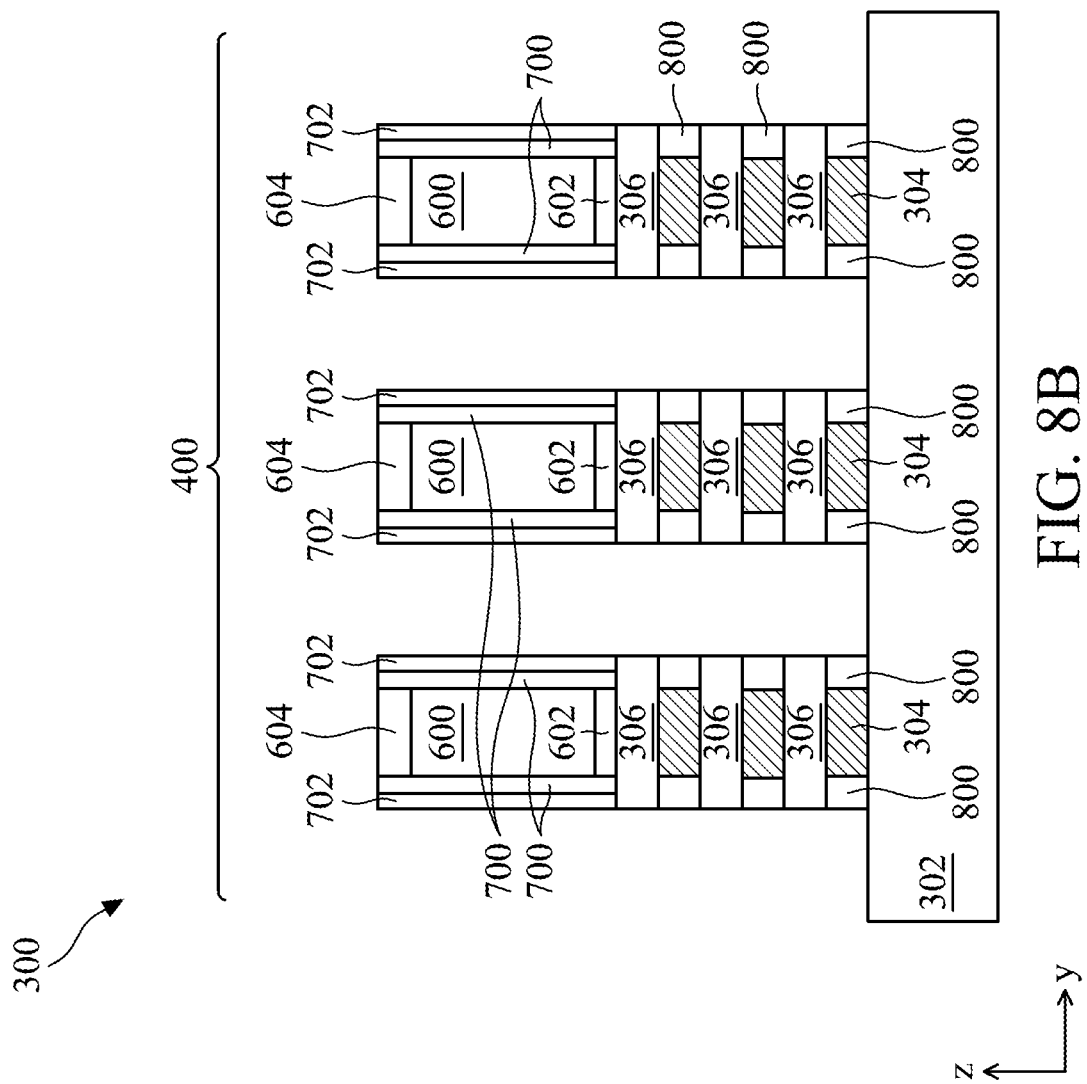

Corresponding to operation 212 of FIG. 2, FIGS. 8A-B are cross-sectional views of the nanostructure transistor device 300 cut along the Y-direction including inner spacers 800 at one of the various stages of fabrication. As shown in FIGS. 8A-B, the inner spacers 800 can be formed along the etched ends of each of the first semiconductor layers 304 and along respective ends (along the X-direction) of each of the semiconductor layers 304 and 306. In other embodiments, the inner spacers 800 are not aligned with the ends of the second semiconductor layers 306 such that the second semiconductor layers 800 extend and have a larger width in the Y-direction than the combined width of the inner spacers 800 and the first semiconductor layers 304.

The inner spacers 800 can be formed conformally by chemical vapor deposition (CVD), or by monolayer doping (MLD) of nitride followed by spacer RIE. The inner spacers 800 can be deposited using, e.g., a conformal deposition process (as shown in FIG. 8A) and subsequent isotropic or anisotropic etch back to remove excess spacer material on the sidewalls of the fin structures 400 and on a surface of the semiconductor substrate 302 (as shown in FIG. 8B). A material of the inner spacers 800 can be formed from the same or different material as the first gate spacer 700 (e.g., silicon nitride). For example, the inner spacers 800 can be formed of silicon nitride, silicoboron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors.

Figure 9:
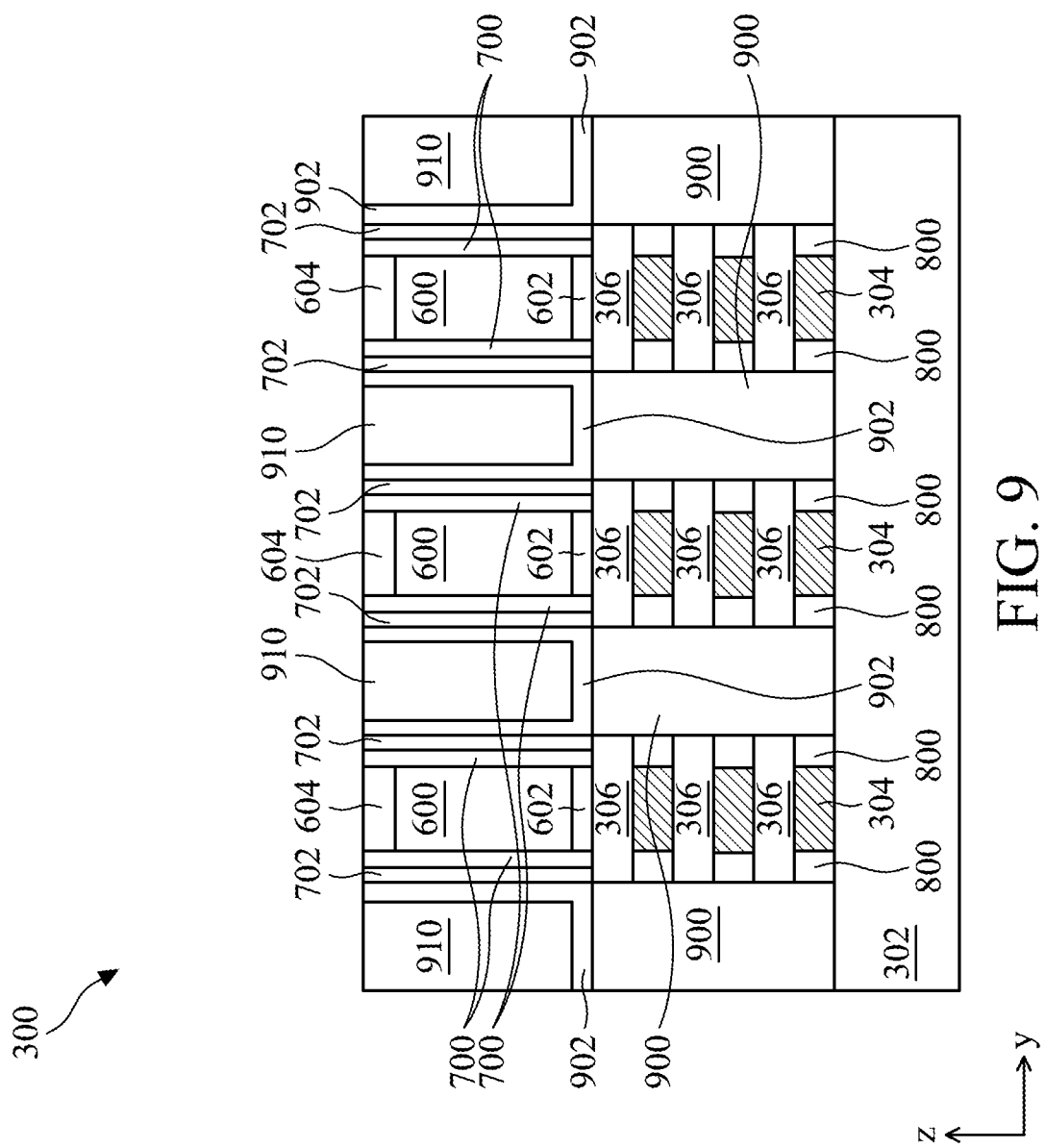

Corresponding to operations 214 and 216 of FIG. 2, FIG. 9 is a cross-sectional view cut along the Y-direction of the nanostructure transistor device 300 including epitaxial structures 900 (sometimes referred to as source/drain structures) and an ILD 910 at various stages of fabrication. As shown in FIG. 9, the epitaxial structures 900 are formed in the source/drain recesses 704 (FIG. 7), respectively. The epitaxial structures 900 are coupled to respective ends (along the X-direction) of the fin structures 400 (FIG. 4), e.g., the respective "shortened" or "etched" ends of each of the second semiconductor layers 306. The ILD 910 is formed on opposing sides (continuously extending along the X-direction) of each of the dummy gate structures 600 to overlay the epitaxial structures 900 with a contact etch stop layer 902 disposed therebetween.

At operation 214, the epitaxial structures 900 may each include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), any other suitable material, or combinations thereof. The epitaxial structures 900 may be formed using an epitaxial layer growth process on exposed ends of each of the second semiconductor layers 306. In some embodiments, the epitaxial structures 900 are aligned with the ends of the inner spacers 800 and the second semiconductor layers 306. In other embodiments, the second semiconductor layers 306 extend into the formed epitaxial structures 900 in the Y-direction and may not be aligned with the ends of the inner spacers 800. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes. In some embodiments, a bottom surface of the epitaxial structures 900 may be leveled with the top surface of the isolation structure 504 in the X-direction. In some other embodiments, the bottom surface of the epitaxial structures 900 may be lower than the top surface of the isolation structure 504.

In-situ doping (ISD) may be applied to form doped epitaxial structures 900, thereby creating the junctions for the nanostructure transistor device 300. For example, when the nanostructure transistor device 300 is configured in n-type, the epitaxial structures 900 can be doped by implanting n-type dopants, e.g., arsenic (As), phosphorous (P), etc., into them. When the nanostructure transistor device 300 is configured in p-type, the epitaxial structures 900 can be doped by implanting p-type dopants, e.g., boron (B), etc., into them.

At operation 216, the ILD 910 is formed. The contact etch stop layer 902 may be first formed over the epitaxial structures 900 and the dummy gate structures 600. The contact etch stop layer 902 can function as an etch stop layer in a subsequent etching process, and may comprise a suitable material such as silicon oxide, silicon nitride, silicon oxynitride, titanium, titanium nitride, combinations thereof, or the like, and may be formed by a suitable formation method such as CVD, PVD, any other suitable method, or combinations thereof. The contact etch stop layer 902 may have a thickness in the Y-direction in a range in between about 5 Angstroms and about 50 Angstroms, inclusive (e.g., 5, 15, 25, 35, 45, and 50 Angstroms) or any other suitable thickness.

Next, the ILD 910 is formed over the contact etch stop layer 902. In some embodiments, the ILD 910 is formed of a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. Next, a planarization process, such as a CMP process, may be performed to achieve a level top surface for the ILD 910. The CMP may also remove the mask 604 and portions of the contact etch stop layer 902 disposed over the mask 604. After the planarization process, the top surface of the ILD 910 is level with a top surface of the dummy gate structures 600, in some embodiments. In some embodiments, the contact etch stop layer 902 and the gate spacers 700 (and 702 if present) may be laterally spaced along the Y-direction by a second gate spacer 702 disposed between the two.

Figure 10:
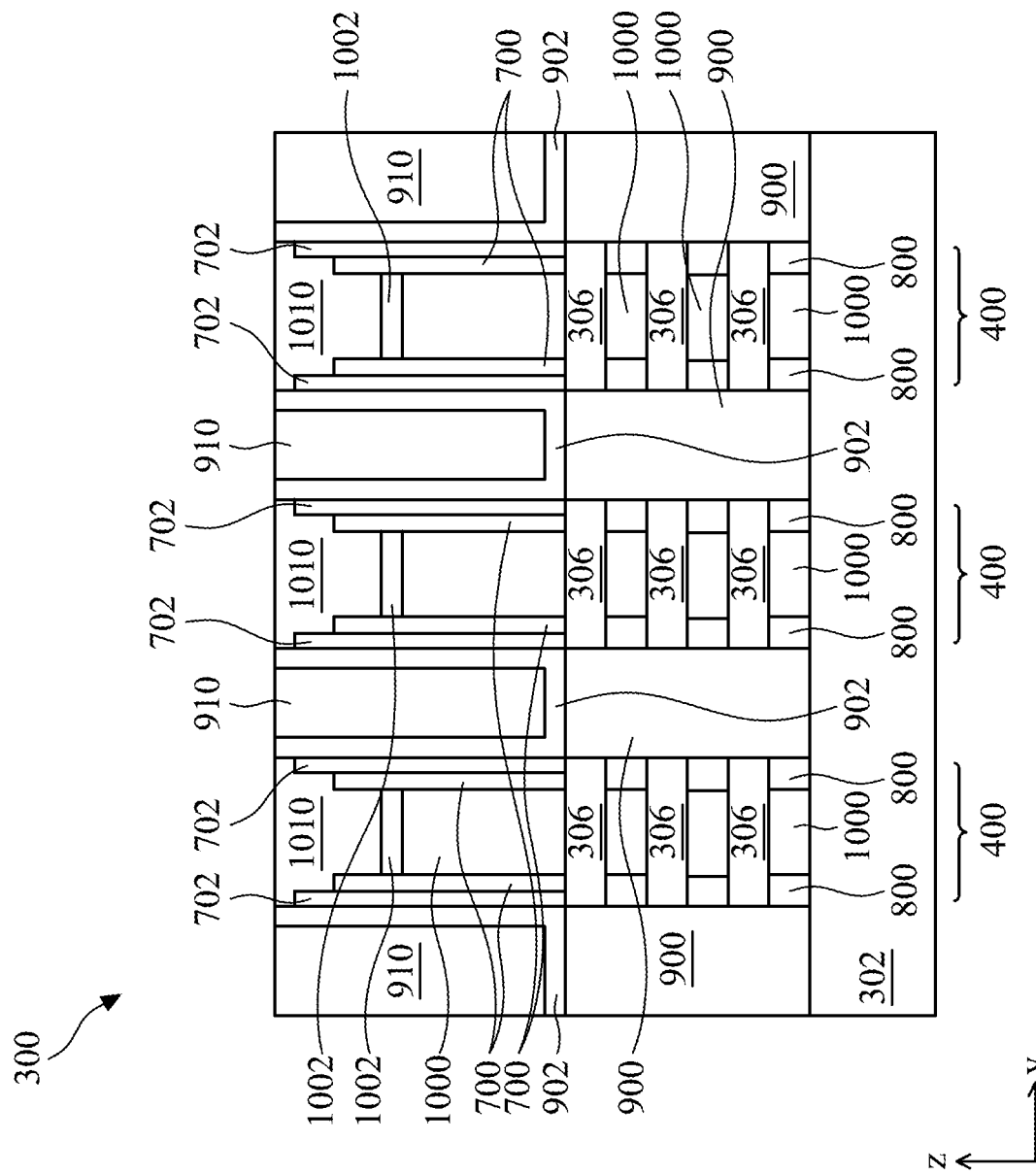

Corresponding to operation 218 of FIG. 2, FIG. 10 is a cross-sectional views cut along the Y-direction of the nanostructure transistor device 300 in which the active gates structures 1000 and metal contact layers 1002 are formed at one of the various stages of fabrication.

Subsequently to forming the ILD 910 and exposing the dummy gate structures 600 (FIG. 9), the dummy gate structures 600, the etch stop layer 602, the patterned mask 402 (if still present), and the first semiconductor layers 304 are sequentially removed. The dummy gate structures 600, the etch stop layer 602, and the patterned mask 402 (if any) can be removed by an etching process, e.g., RIE, chemical oxide removal (COR), or any other suitable process. After removing the dummy gate structures 600, the etch stop layer 602, and the patterned mask 402, the top surface of each of the fin structures 400 (e.g., the top surface of the topmost semiconductor layers 306) is exposed. In addition to the top surface, sidewalls of each fin structure 400 (facing the Y-direction) may be exposed. Next, the first semiconductor layers 304 are removed from each of the fin structures 400 by applying a selective etch (e.g., a hydrochloric acid (HCl)), while leaving the second semiconductor layers 306 substantially intact. After the removal of the first semiconductor layers 304, respective bottom surface and top surface of each of the second semiconductor layers 306 may be exposed.

In some embodiments, a portion of the first gate spacers 700 and the second gate spacers 702 in the Z-direction may also be removed. The portions may be removed concurrently with the removal of the dummy gate structures 600. The first gate spacers 700 and the second gate spacers 702 may be removed by an etching process, e.g., RIE, chemical oxide removal (COR), or any other suitable process. This removal may result in the contact etch stop layer 902, the second gate spacers 702, and the first gate spacers 700 having different heights along the Z-direction. In some embodiments, the contact etch stop layer 902 may have a contact etch stop layer height that is greater than a second gate spacer height or a gate spacer height. In some embodiments, the second gate spacer height may be greater than the gate spacer height. In some embodiments, the second gate spacer height may be equal to the gate spacer height. In some embodiments, the contact etch stop layer 902, the second gate spacers 702, and the first gate spacers 700 may form a staircase along the Y-direction. The staircase may provide a recess to be filled by subsequently-formed layers. In some embodiments, the contact etch stop layer height is equal to the second gate spacer height and the gate spacer height. In some embodiments, the contact etch stop layer height, the gate spacer height, and the second gate spacer height may be in between about 10 and about 50 nanometers, inclusive (e.g., 10, 20, 30, 40, and 50 nanometers).

Then, at operation 218, one or more active gate structures 1000 (sometimes referred to as gate structures) are formed. Each of the active gate structures includes a gate dielectric and a gate metal, in some embodiments. In some embodiments, each of the active gate structures 1000 includes a gate dielectric and a gate metal (not separately shown in FIG. 10). As shown in FIG. 10, the active gate structures 1000 may be disposed in the exposed cavities left by the dummy gate structures 600 and the first semiconductor layers 304. In some embodiments, the active gate structures 1000 disposed above the second semiconductor layer 306 may have a height in the Z-direction in a range in between about 5 nanometers to 30 nanometers, inclusive (e.g., 5, 7, 10, 15, 20, 25, and 30 nanometers). In some embodiments, the active gate structures 1000 disposed above the second semiconductor layers 306 may have a width in the Y-direction in a range in between about 9 and about 100 nanometers, inclusive (e.g., 9, 10, 15, 20, 30, 40, 50, 60, 70, 80, 90, and 100 nanometers).

In some embodiments, a metal contact layer 1002 may be disposed on a top surface of the active gate structure 1000. The metal contact layer 1002 (sometimes referred to as a gate contact) is formed to electrically couple to the active gate structure 1000. In some embodiments, the metal contact layer 1002 may be formed from a barrier layer, a seed layer, and a fill metal. The barrier layer includes an electrically conductive material such as titanium nitride, although other materials, such as tantalum nitride, titanium, tantalum, any other suitable material, or combinations thereof, may alternatively be utilized. The barrier layer may be formed using a CVD process such as PECVD or any other suitable process such as sputtering, metal organic chemical vapor deposition (MOCVD), or ALD, may alternatively be used.

The seed layer is formed over the barrier layer and may include copper, titanium, tantalum, titanium nitride, tantalum nitride, any other suitable material, or a combination thereof and may be deposited by ALD, sputtering, PVD, or any other suitable process. In some embodiments, the seed layer is a metal layer, which may be a single layer or a composite layer comprising a plurality of sub-layers formed of different materials. For example, the seed layer may include a titanium layer and a copper layer over the titanium layer.

The fill metal is deposited over the seed layer and fills the remaining portions of the metal contact layer 1002. The fill metal may be a metal-containing material such as copper, aluminum, tungsten, any other suitable material, combinations thereof, or multi-layers thereof and may be formed by any other suitable method such as electroplating or electroless plating. After the formation of the fill metal, a planarization process such as a CMP may be performed to remove the excess portions of the barrier layer, the seed layer, and the fill metal. The resulting remaining portions of the barrier layer, the seed layer, and the fill metal form the metal contact layer 1002.

The metal contact layer 1002 may have a thickness in the Z-direction in between about 1 and about 10 nanometers, inclusive (e.g., 1, 2, 3, 4, 5, 6, 7, 8, 9, and 10 nanometers) or any other suitable thickness. In some embodiments, a capping layer 1010 may be disposed above the metal contact layer 1002. The capping layer 1010 may be formed by a suitable formation method such as CVD, PVD, any other suitable method, or combinations thereof. The capping layer 1010 may comprise SiN, Si, SiOCN, SiOC, SiON, multi-layers thereof, or any other suitable material. In some embodiments, a CMP process may be applied to the capping layer 1010 in order to level a top surface of the capping layer 1010 with the ILD 910. The capping layer 1010 may be formed to protect one or more of the active gate structures 1000 during the formation of any other structure (e.g., contact structures).

In some embodiments, a subset of the second semiconductor layers 306 that are vertically arranged from one another is collectively configured as the channel structure of a nanostructure FET device. In some embodiments, multiple such subsets can collectively be configured as the channel structure of a nanostructure FET device. In other words, in one embodiment, the channel structure can include a plurality of discrete nanostructures vertically separated from each other. In another embodiment, the channel structure can include a fin structure integrally formed form a substrate. The plurality of second semiconductor layers 306 comprises nanostructures (e.g., nanosheets, nanowires, etc.) and results in a plurality of nanostructures vertically spaced apart from one another. In such embodiments, the gate structures 1000 formed from the gate dielectric and the gate metal wrap around each of the plurality of nanostructures.

The gate dielectric may be formed of different high-k dielectric materials or a similar high-k dielectric material. Example high-k dielectric materials include a metal oxide or a silicate of Hf, Al, Zr, La, Mg, Ba, Ti, Pb, any other suitable material, or combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric 1004 may optionally include a substantially thin oxide (e.g., $SiO_x$) layer.

Figure 11A:
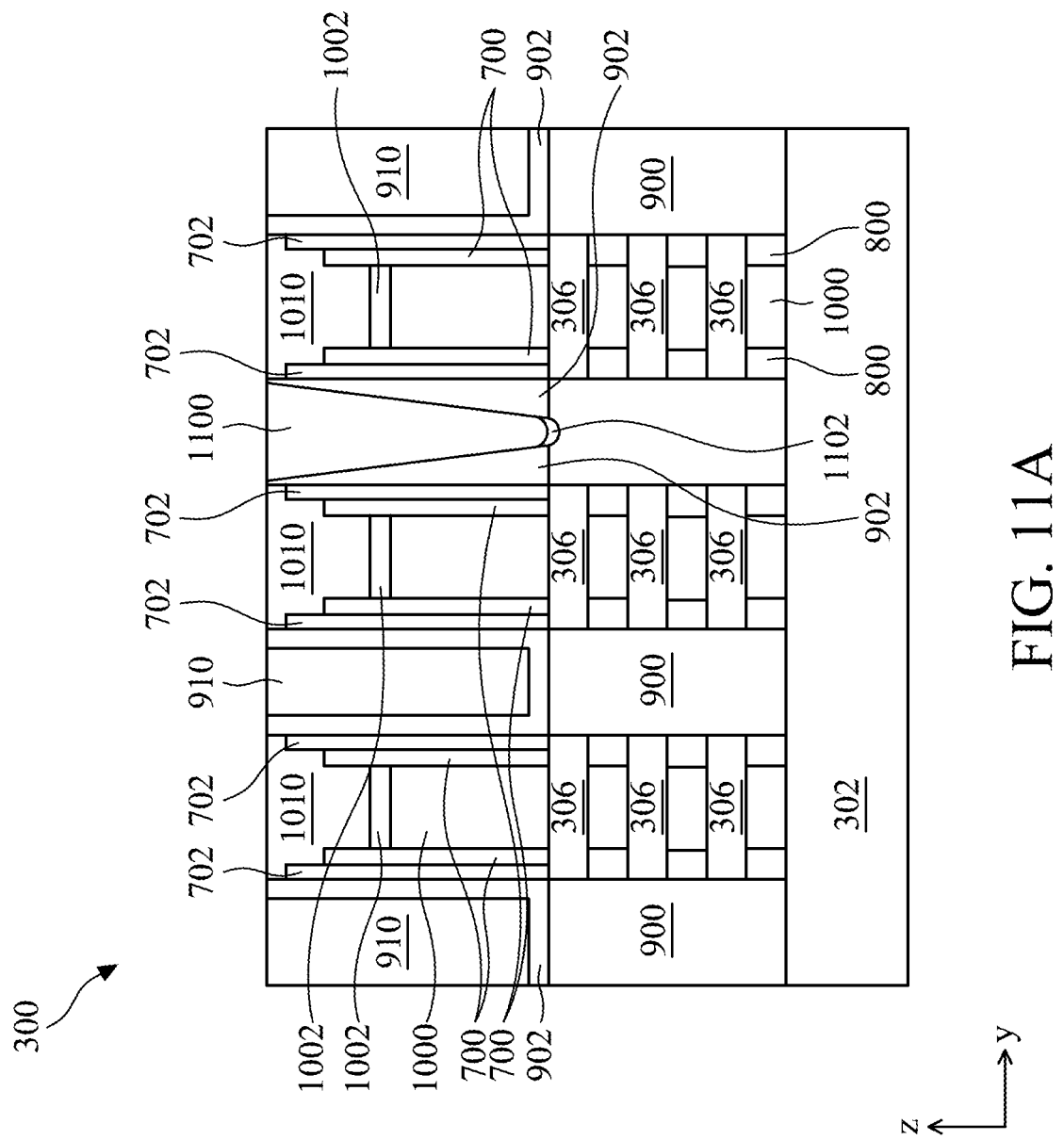
Figure 11B:
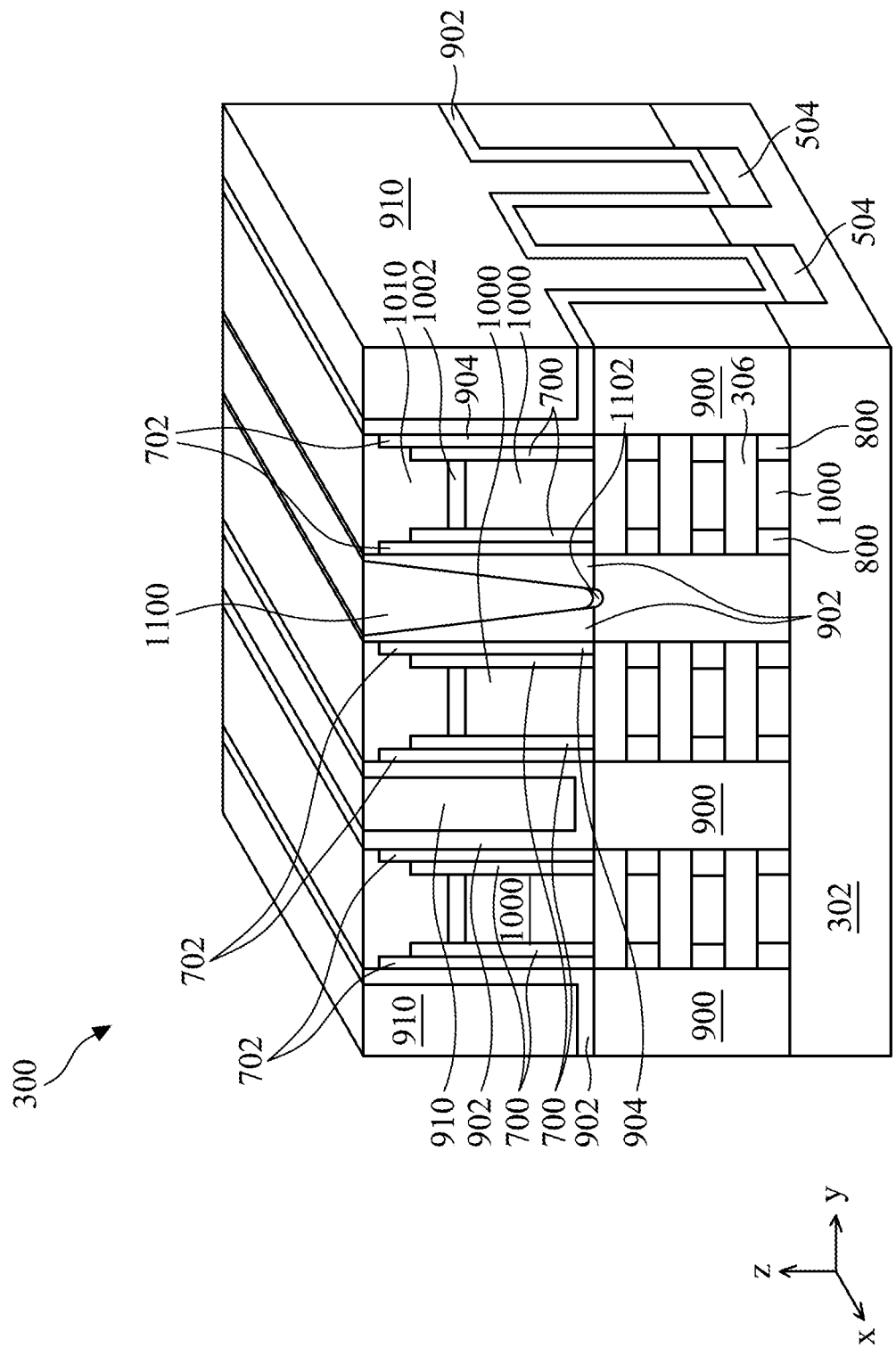
FIGS. 11B, 15B, and 16B illustrate perspective views of the example nanostructure transistor device (or a portion of the example nanostructure transistor device) during various fabrication stages, made by the method of FIGS. 2A-B, in accordance with some embodiments.

The gate metal may include a stack of multiple metal materials. For example, the gate metal may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, $TaA_1C$, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process Corresponding to operation 220 of FIG. 2, FIGS. 11A-B are a cross-sectional view cut along the Y-direction and a perspective view, respectively, of the nanostructure transistor device 300 in which a first contact structure 1100 is formed in one of the various stages of fabrication.

At least one photoresist layer corresponding to operation 1940 (also referred to as a resist layer, photosensitive layer, patterning layer, light sensitive layer, etc.) that is responsive to an exposure process for creating patterns is formed on a top surface of the transistor device. The photoresist layer may be a positive-type or negative-type resist material and may form a multi-layer structure. One example resist material is a chemical amplifier (CA) resist. Then, a photolithography process corresponding to operation 1942 may be applied to the photoresist layer(s). The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the photoresist layer while protecting one or more other portions of the photoresist layer. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultra-violet radiation, extreme ultraviolet (EUV) radiation, and/or combinations thereof.

A recess may be formed in the ILD 910 and the contact etch stop layer 902 through an etching process, including various dry etching, wet etching, and/or other etching methods (e.g., reactive ion etching). In some embodiments, the recess may be formed to expose the top surface of the epitaxial structure 900. In some embodiments, the recess is vertically sandwiched between two active gate structures 1000, as shown in FIG. 11A. In some embodiments, the recess is formed in contact vertically with the contact etch stop layer 902. The face of recess may be a rectangular shape, but the face of recess is not limited to a rectangular shape. In such embodiments, the width of the recess along the Y-direction may be between about 5 and about 35 nanometers, inclusive (e.g. 5, 10, 15, 20, 25, 30, and 35 nanometers). In such embodiments, the length of the recess along the X-direction may be between about 5 and about 105 nanometers, inclusive (e.g. 5, 15, 25, 35, 45, 55, 65, 75, 85, 95, and 105 nanometers). In some embodiments, the height of the recess along the Z-direction may be between about 20 and about 50 nanometers, inclusive (e.g., 20, 30, 40 and 50 nanometers).

The face of the recess may be formed in the shape of a triangle, trapezoid, circle, rectangle, or other combination of shapes thereof. In some embodiments, the angle of the sidewalls of the recess to the top surface of the epitaxial structure 900 may be between about 85 and about 90 degrees, inclusive (e.g. 85, 86, 87, 88, 89, and 90 degrees). The top surface of the epitaxial structure 900 is shown to be exposed in FIG. 11A, but it is understood that the recess may be formed to expose the top surface of any epitaxial structure. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$, $C_4F_6$, $C_4F_8$), chlorine-containing gas (e.g., $C_{12}$, and/or $BCl_3$), bromine-containing gas (e.g., HBr), other suitable gases and/or plasmas, or combinations thereof. After the etching process, the remaining photoresist layer(s) are removed by any suitable process, including a photoresist stripping process. It is understood that multiple photoresist layers may be simultaneously or independently removed.

The first contact structure 1100 (sometimes referred to as a first interconnect structure) may be formed by filling the recess with a metal material, followed by a CMP process to remove any excess material and provide a level surface for the first contact structure 1100 with the ILD 910. The metal material may include cobalt (Co), formed by a suitable method, such as PVD, CVD, electroplating, electroless plating, or the like. Besides tungsten, other material materials, such as copper (Cu), gold (Au), tungsten (W), Ruthenium (Ru), combinations thereof, multi-layers thereof, alloys thereof, or the like, may also be used to form the first contact structure 1100. The first contact structure 1100 is disposed on the top surface of an epitaxial structure such as 900 and is electrically coupled with said surface, as shown in FIG. 11A. The first contact structure 1100 extends along the X-direction as shown in FIG. 11B. In some embodiments, the first contact structure 1100 includes the same shape and dimensions as the recess formed previously. In some embodiments, the gate spacer 700 is interposed between the first contact structure 1100 and the active gate structure 1000. In some embodiments, the second gate spacer 702 is interposed between the first contact structure 1100 and the gate spacer 700. It is understood that a FinFET device may include multiple first contact structures or that the first contact structure can be electrically coupled to any epitaxial structure. In various embodiments, the first contact structure 1100 may be part of a middle-end-of-line (MEOL) interconnection network, where such contact structures are sometimes referred to as "MDs."

In some embodiments, the first contact structure 1100 may further comprise a silicide layer 1102 disposed in between the epitaxial structure 900 and the first contact structure 1100, as shown in FIG. 11A-B. The silicide layer 1102 reduces the contact resistance of the epitaxial structure 900 and the first contact structure 1100. The silicide layer 1102 may include a mixture of metal and semiconductor materials such as platinum silicides, titanium silicides, cobalt silicides, nickel silicides, tungsten silicides, molybdenum silicides, tantalum silicides, other metallic silicides, germanides, polycides, salicides, combinations thereof, multi-layers thereof, alloys thereof, or any other suitable material. The silicide layer 1102 is formed before the first contact structure 1100. The silicide layer 1102 may be formed from sputtering a metal film on a silicon wafer surface using a method such as but not limited to PVD, heating the silicon wafer in order to react the silicon and the metal to form a metallic silicide, and removing the metal film. In some embodiments, the silicide layer 1102 is optional. It is understood that a nanostructure transistor device may include multiple silicide layers in between multiple first contact structures and epitaxial structures.

In some embodiments, the first contact structure 1100 has a contact width with the silicide layer 1102 or the epitaxial structure 900 along the Y-direction of between about 10 and about 30 nanometers, inclusive (e.g., 10, 15, 20, 25, and 30 nanometers). In some embodiments, the first contact structure 1100 has a contact length with the silicide layer 1102 or the epitaxial structure 900 along the X-direction of between about 10 and about 100 nanometers, inclusive (e.g., 10, 20, 30, 40, 50, 60, 70, 80, 90, and 100 nanometers). In some embodiments, the first contact structure 1100 is at an angle of between about 85 and about 90 degrees to the epitaxial structure 900 (e.g., 85, 86, 87, 88, 89, and 90 degrees).

Figure 12:
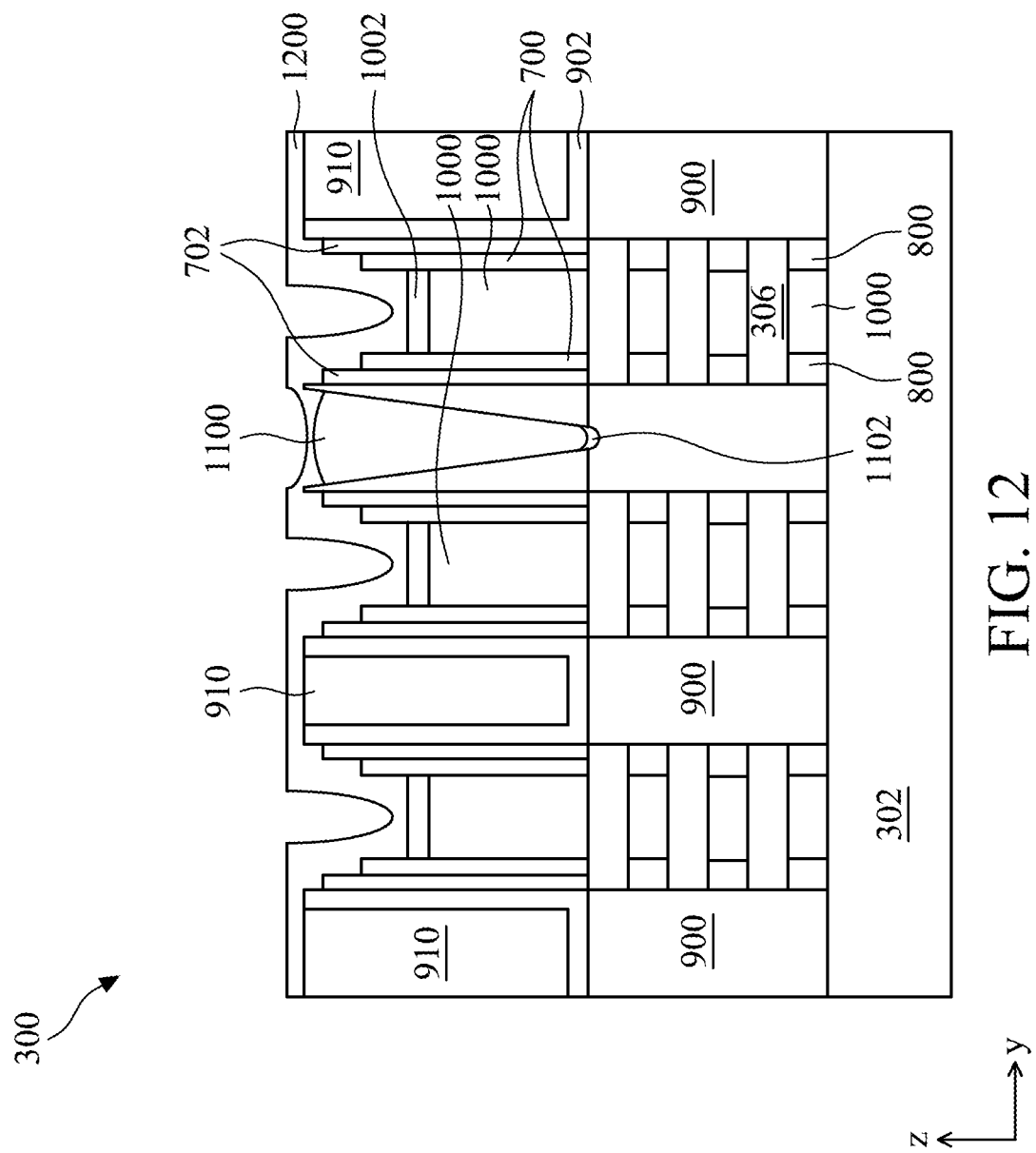

Corresponding to operation 222 in FIG. 2, FIG. 12 is a cross-sectional view cut along Y-direction of the nanostructure transistor device 300 in which a nitride-based conformal layer 1200 is formed in fabrication with various stages.

The capping layer 1010 (shown in FIGS. 11A-B) may be removed from the nanostructure transistor device 300. The capping layer 1010 may be removed by any suitable method such as through an etching process, including various dry etching, wet etching, and/or other etching methods (e.g., reactive ion etching). In some embodiments, the capping layer 1010 is completely removed from the nanostructure transistor device 300. In other embodiments, a portion of the capping layer 1010 may remain in the nanostructure tranistor device 300. Then, the nitride-based conformal layer 1200 may be disposed above the active gate structures 1000/metal contact layer 1002, the gate spacers 700, the second gate spacers 702, the contact etch stop layer 902, the ILD 910, and the first contact structure 1100. The nitride-based conformal layer 1200 is relatively thin in comparison to the relatively thick etch stop layer (e.g., SiN) typically used in nanostructure transistor devices 300 that fully overlays gate structures. The nitride-based conformal layer 1200 may have a thickness in the Z-direction in a range between about 1 and about 10 nanometers, inclusive (e.g., 1, 2, 3, 4, 5, 6, 7, 8, 9, and 10 nanometers).

The nitride-based conformal layer 1200 may have a dip (or recess) over the active gate structures 1000 and/or the first contact structure 1100 due to the staircase formation of the contact etch stop layer 902, the second gate spacers 702, and the gate spacers 700. In particular, the dip of the nitride-based conformal layer 1200 over the first contact structure 1100 can extend along the X-direction (into and/or out of the plane) with a certain length, for example, with a same length as the first contact structure 1100. The nitride-based conformal layer 1200 may comprise SiN or any other suitable material and may be formed by any suitable deposition process such as CVD (such as PECVD, HARP, or combinations thereof) process, ALD process, another applicable process, or a combination thereof. An anneal process may be performed once the nitride-based conformal layer 1200 is formed. In some embodiments, the anneal process includes $H_2$ and results in a concave top surface of the first contact structure 1100.

Figure 13:
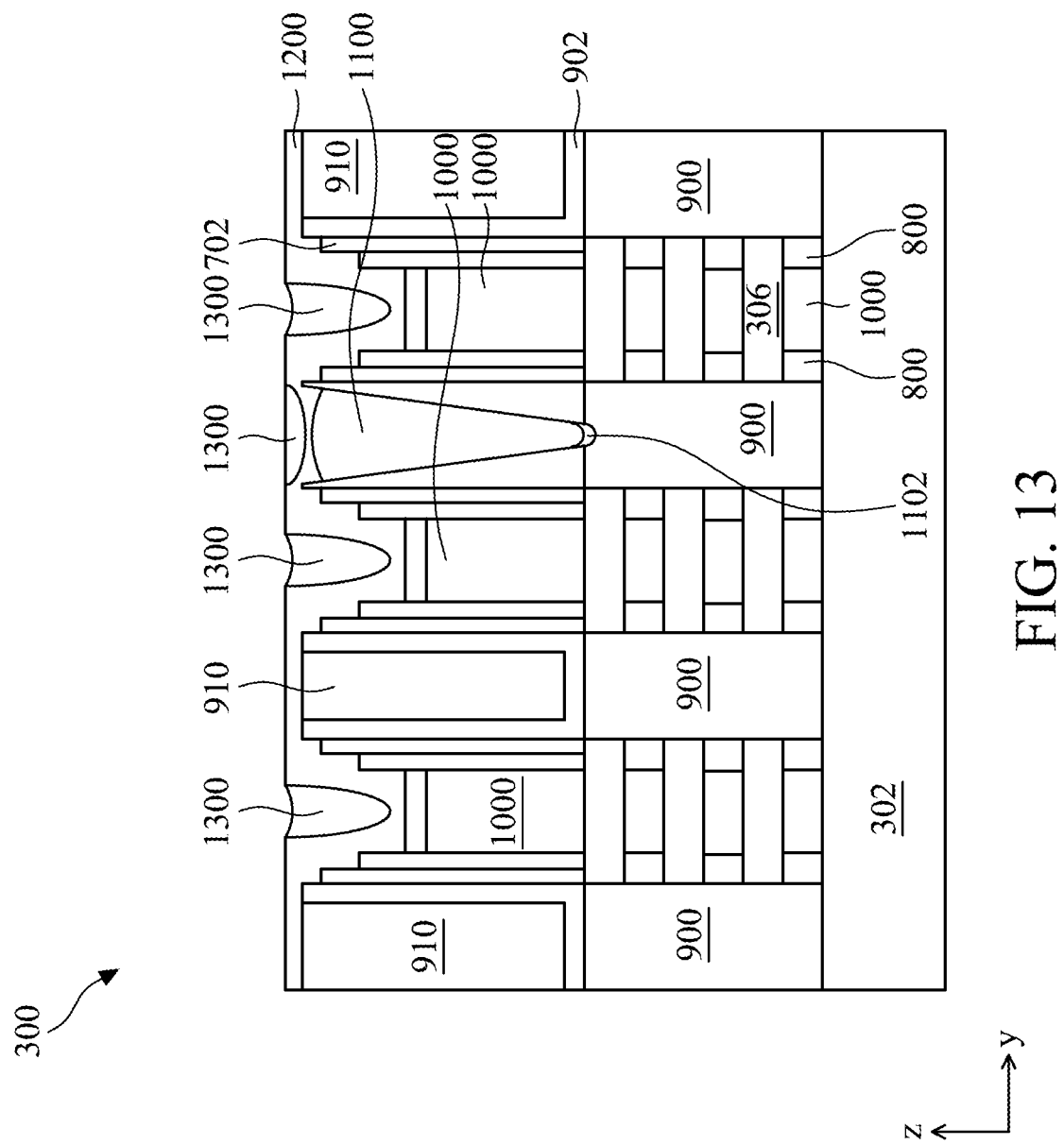

Corresponding to operation 224 of FIG. 2, FIG. 13 is a cross-sectional view cut along the Y-direction of the nanostructure transistor device 300 in which an oxide-based layer 1300 is formed over the nitride-based conformal layer 1200 in fabrication with various stages.

The oxide-based layer 1300 is conformally formed over the nitride-based conformal layer 1200, particularly in the dips in the nitride-based conformal layer 1200 due to the relative thinness of the nitride-based conformal layer 1200. The oxide-based layer 1300 is also formed due to the larger capacitance of the nitride-based conformal layer 1200 in comparison to the previously formed capping layer 1010. A CMP process may be applied to the oxide-based layer 1300 after formation in order to planarize the oxide-based layer 1300 with the nitride-based conformal layer 1200. The oxide-based layer 1300 may follow the dips of the nitride-based conformal layer 1200. As such, the oxide-based layer 1300 may have a number of concave profiles, as shown. The concave angle may be in between about 0 and about 45 degrees, inclusive, to the ILD 910 (e.g., 0, 5, 10, 15, 20, 25, 30, 35, 40, and 45 degrees) or any other suitable angle.

In some embodiments, the oxide-based layer 1300 may be disposed over the active gate structures 1000 and the first contact structure 1100. The oxide-based layer 1300 may have a height in the Z-direction in a range in between about 5 to about 50 nanometers, inclusive (e.g., 5, 10, 15, 20, 25, 30, 35, 40, and 50 nanometers) or any other suitable height. The oxide-based layer 1300 may comprise a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. The oxide-based layer 1300 has a smaller dielectric constant than the typical SiN etch stop layer used in nanostructure transistor devices.

Figure 14:
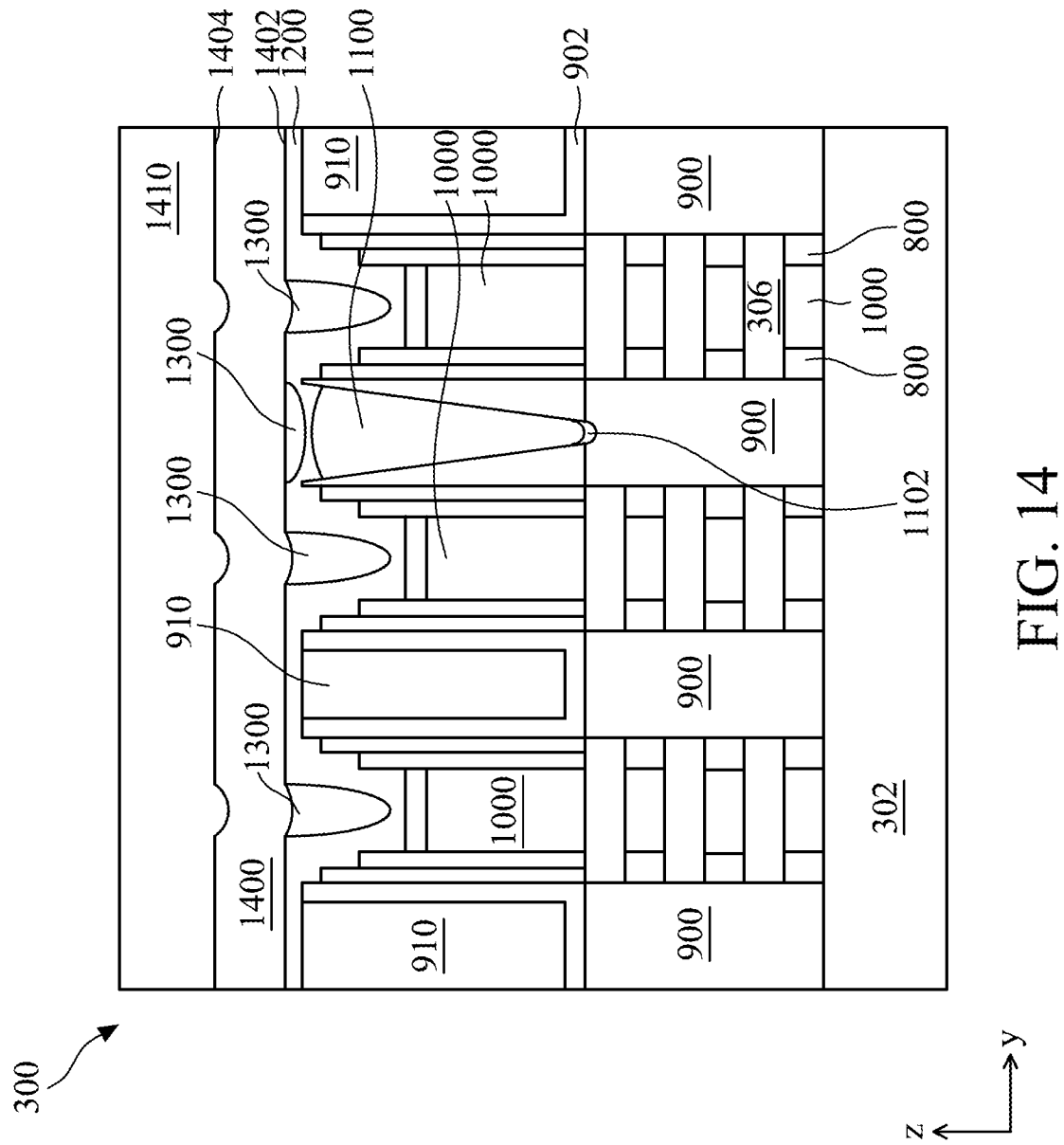

Corresponding to operations 226 and 228 of FIG. 2, FIG. 14 is cross-sectional view cut along the Y-direction of the nanostructure transistor device 300 in which an etch stop layer 1400 is disposed above the oxide-based layer 1300 and a second oxide-based layer 1410 is disposed above the etch stop layer 1400 in fabrication with various stages.

The etch stop layer 1400 is disposed above the oxide-based layer 1300. The etch stop layer 1400 has a top surface 1402 and a bottom surface 1404. In some embodiments, a portion of the top surface 1402 has a dip over the portions of the oxide-based layer 1300 that have dips as well. In some embodiments, a portion of the bottom surface 1402 also has a dip over the portions of the oxide-based layer 1300 that have dips. The dips in the etch stop layer 1400 may have a contact angle in between a range of about 0 degrees to about 45 degrees, inclusive, to the ILD 910 (e.g., 0, 5, 10, 15, 20, 25, 30, 35, 40, and 45 degrees). The etch stop layer 1400 may have a thickness in the vertical direction in between about 3 and about 12 nanometers, inclusive (e.g., 3, 4, 5, 6, 7, 8, 9, 10, 11, and 12 nanometers). The etch stop layer 1400 can function as an etch stop layer in a subsequent etching process, and may comprise a suitable material such as silicon oxide, silicon nitride, silicon oxynitride, titanium, titanium nitride, combinations thereof, or the like, and may be formed by a suitable formation method such as CVD, PVD, any other suitable method, or combinations thereof.

The second oxide-based layer 1410 is disposed above the etch stop layer 1400. The second oxide-based layer 1410 may have a bottom surface with a dip over the portions of the etch stop layer 1400 that have a dip. The dips in the second oxide-based layer 1410 may have a contact angle in between a range of about 0 degrees to about 45 degrees, inclusive, to the ILD 910 (e.g., 0, 5, 10, 15, 20, 25, 30, 35, 40, and 45 degrees). A top surface of the second oxide-based layer may comprise no dips and may be a flat surface. The second oxide-based layer 1410 may contain a dielectric material such as silicon oxide, phosphosilicate glass (PSG), borosilicate glass (BSG), boron-doped phosphosilicate Glass (BPSG), undoped silicate glass (USG), any other suitable material, or the like, and may be deposited by any suitable method, such as CVD, PECVD, or FCVD. Next, a planarization process, such as a CMP process, may be performed to achieve a level top surface for the second oxide-based layer 1410.

Figure 15A:
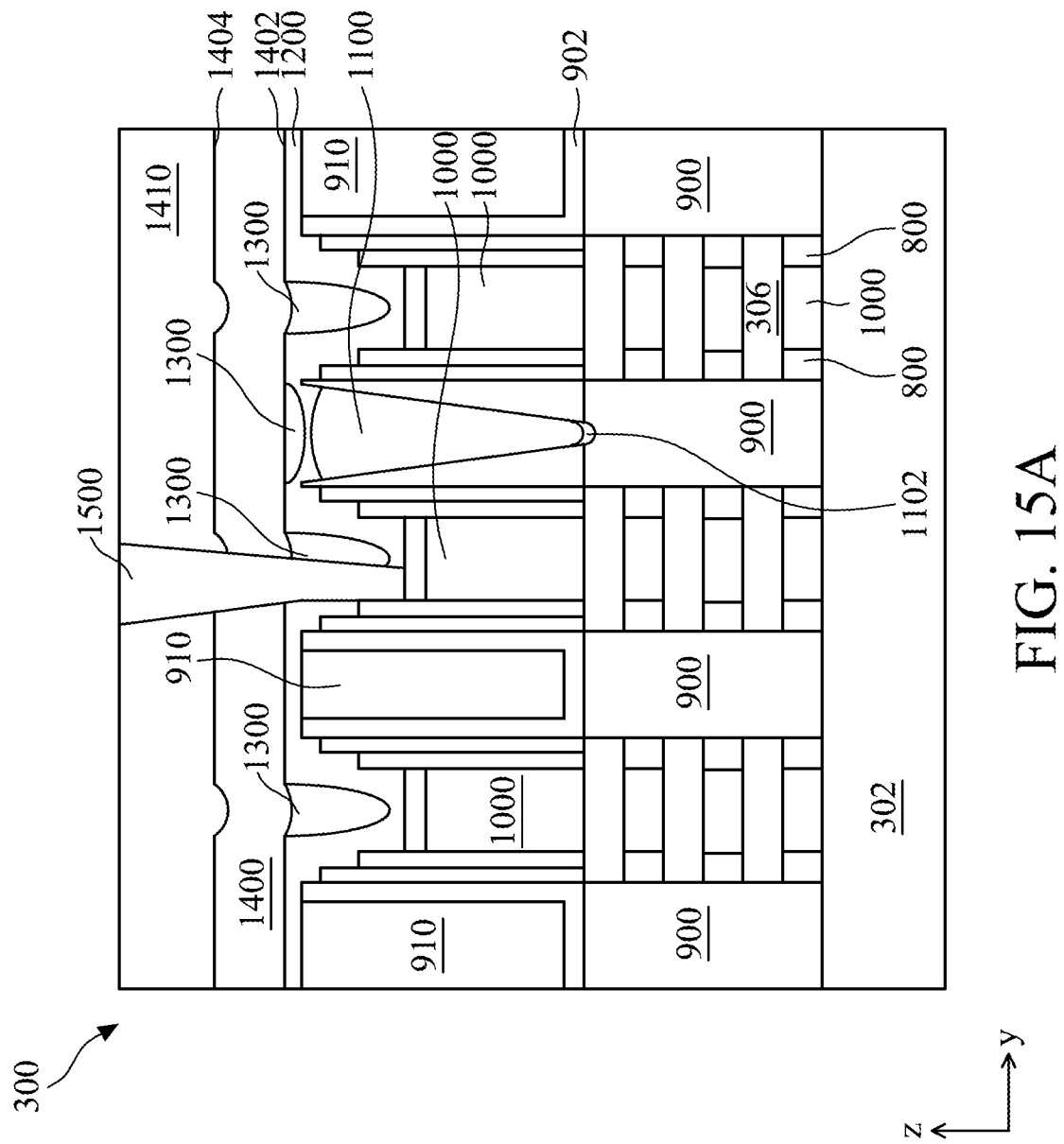
Figure 15B:
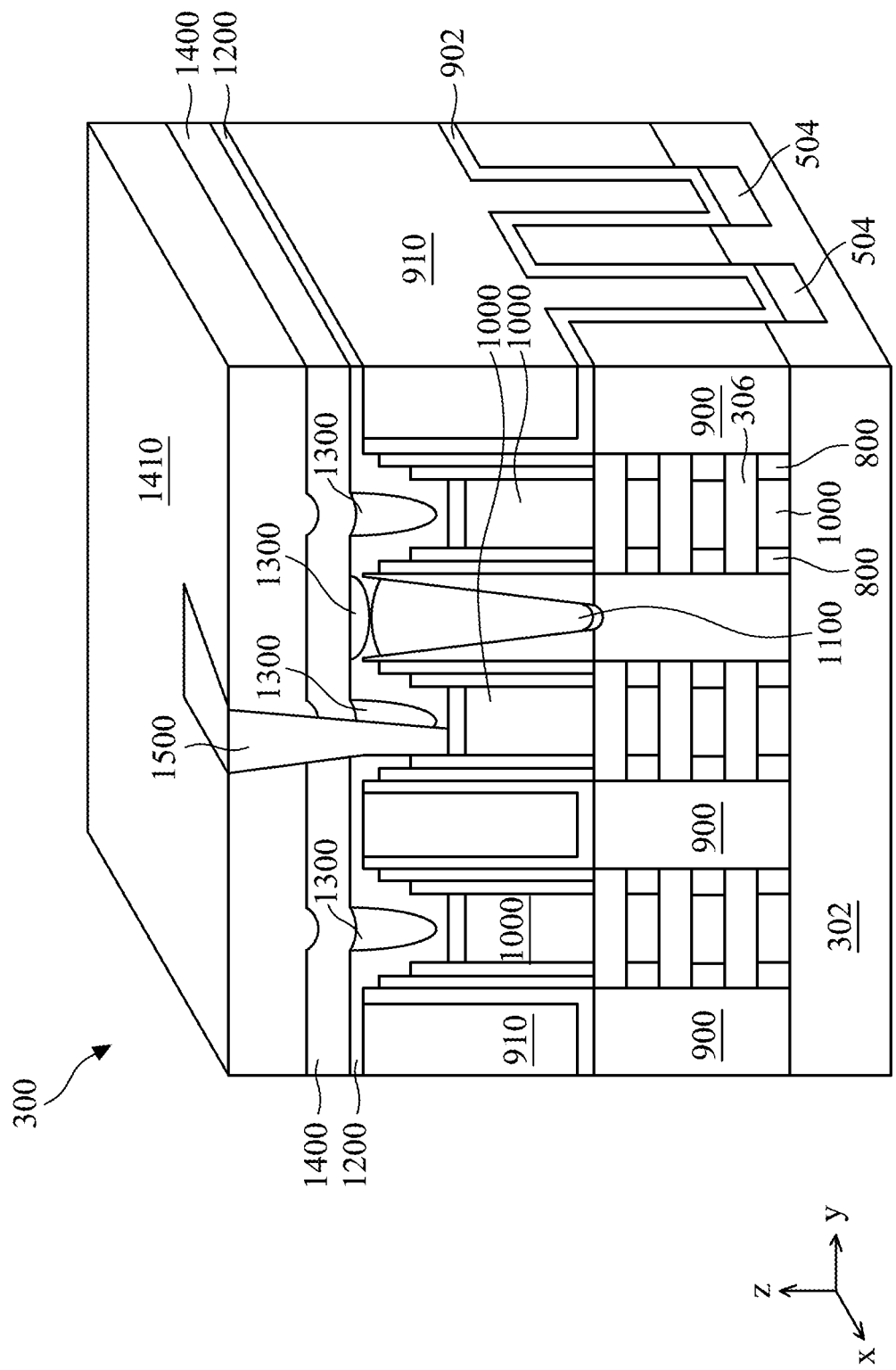

Corresponding to operation 230 of FIG. 2, FIGS. 15A-B are a cross-sectional view cut along the Y-direction and a perspective view, respectively, of the nanostructure transistor device 300 in which a second contact structure 1500 is formed at one of the various stages of fabrication.

At least one photoresist layer corresponding to operation 1940 (also referred to as a resist layer, photosensitive layer, patterning layer, light sensitive layer, etc.) that is responsive to an exposure process for creating patterns is formed on a top surface of the transistor device. The photoresist layer may be a positive-type or negative-type resist material and may form a multi-layer structure. One example resist material is a chemical amplifier (CA) resist. Then, a photolithography process corresponding to operation 1942 may be applied to the photoresist layer(s). The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the photoresist layer while protecting one or more other portions of the photoresist layer. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Then, a recess may be formed in the second oxide-based layer 1410, the etch stop layer 1400, the oxide-based layer 1300, and the nitride-based conformal layer 1200 through an etching process, including various dry etching, wet etching, and/or other etching methods (e.g., reactive ion etching). In some embodiments, the recess may be formed to expose the top surface of the active gate structure 1100 or metal contact layer 1102. In some embodiments, the recess is vertically sandwiched between the ILD 910 and the first contact structure 1100, as shown in FIG. 15A. In some embodiments, the recess is formed in contact vertically with the nitride-based conformal layer 1200. The nitride-based conformal layer 1200 provides an etch selectively when forming the recess which allows the recess to be accurately controlled and formed while minimizing damage to the first contact structure 1100 (e.g., under a misalignment scenario). Accordingly, leakage from the epitaxial structures 900 or the first contact structure 1100 can be minimized. The face of recess may be a rectangular shape, but the face of recess is not limited to a rectangular shape.

The face of the recess may be formed in the shape of a triangle, trapezoid, circle, rectangle, or other combination of shapes thereof. In some embodiments, the angle of the sidewalls of the recess to the top surface of the active gate structure 1000 may be between about 85 and about 90 degrees, inclusive (e.g. 85, 86, 87, 88, 89, and 90 degrees). The recess may be formed to not be perfectly aligned with the active gate structure, as shown in FIG. 15A. The top surface of the metal contact layer 1102 on the active gate structure 1000 is shown to be exposed in FIG. 15A, but it is understood that the recess may be formed to expose the top surface of any metal contact layer or active gate structure. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$, $C_4F_6$, $C_4F_8$), chlorine-containing gas (e.g., $C_{12}$, and/or $BCl_3$), bromine-containing gas (e.g., HBr), other suitable gases and/or plasmas, or combinations thereof. After the etching process, the remaining photoresist layer(s) are removed by any suitable process, including a photoresist stripping process. It is understood that multiple photoresist layers may be simultaneously or independently removed.

The second contact structure 1500 (sometimes referred to as a second interconnect structure) may be formed by filling the recess with a metal material, followed by a CMP process to remove any excess material and provide a level surface for the second contact structure 1500 with the second oxide-based layer 1410. The metal material may include cobalt (Co), formed by a suitable method, such as PVD, CVD, electroplating, electroless plating, or the like. Besides tungsten, other material materials, such as copper (Cu), gold (Au), tungsten (W), Ruthenium (Ru), combinations thereof, multi-layers thereof, alloys thereof, or the like, may also be used to form the second contact structure 1500. The second contact structure 1500 is disposed on the top surface of an active gate structure such as 1000 and is electrically coupled with said surface, as shown in FIG. 15A. The second contact structure 1500 does not continuously extend along the X-direction as shown in FIG. 15B. In some embodiments, the second contact structure 1500 includes the same shape and dimensions as the recess formed previously. It is understood that a FinFET device may include multiple second contact structures or that the second contact structure can be electrically coupled to any active gate structure. In various embodiments, the second contact structure 1500 may be part of a middle-end-of-line (MEOL) interconnection network, where such contact structures are sometimes referred to as "VGs."

In some embodiments, the second contact structure 1500 has a contact width with the active gate structure 1000 along the Y-direction of between about 8.5 nanometers and about 18 nanometers, inclusive (e.g., 8.5, 10, 12, 14, 16, and 18 nanometers). In some embodiments, the second contact structure 1500 has a contact length with the active gate structure 1000 along the X-direction of between about 8 and about 100 nanometers, inclusive (e.g., 8, 20, 30, 40, 50, 60, 70, 80, 90, and 100 nanometers). In some embodiments, the second contact structure 1500 is at an angle of between about 85 and about 90 degrees, inclusive, to the top surface of the active gate structure 1000 (e.g., 85, 86, 87, 88, 89, and 90 degrees). In some embodiments, the second contact structure 1500 may not be perfectly aligned with the active gate structure 1000, as shown in FIGS. 15A-B. In such embodiments, the second contact structure 1500 may be in contact with one gate spacer 700 and not the other. In some embodiments, the second contact structure 1500 is separated from the other gate spacer 700 only with the nitride-based conformal layer 1200. In some embodiments, the second contact structure 1500 is separated from the other gate spacer 700 with the nitride-based conformal layer 1200 and a portion of the oxide-based layer 1300. Due to the smaller dielectric constant of the oxide-based layer 1300 in comparison to the typical SiN etch stop layer, a parasitic delay (e.g., an RC delay), if any, that is associated with the second contact structure 1500 can be significantly reduced.

Figure 16A:
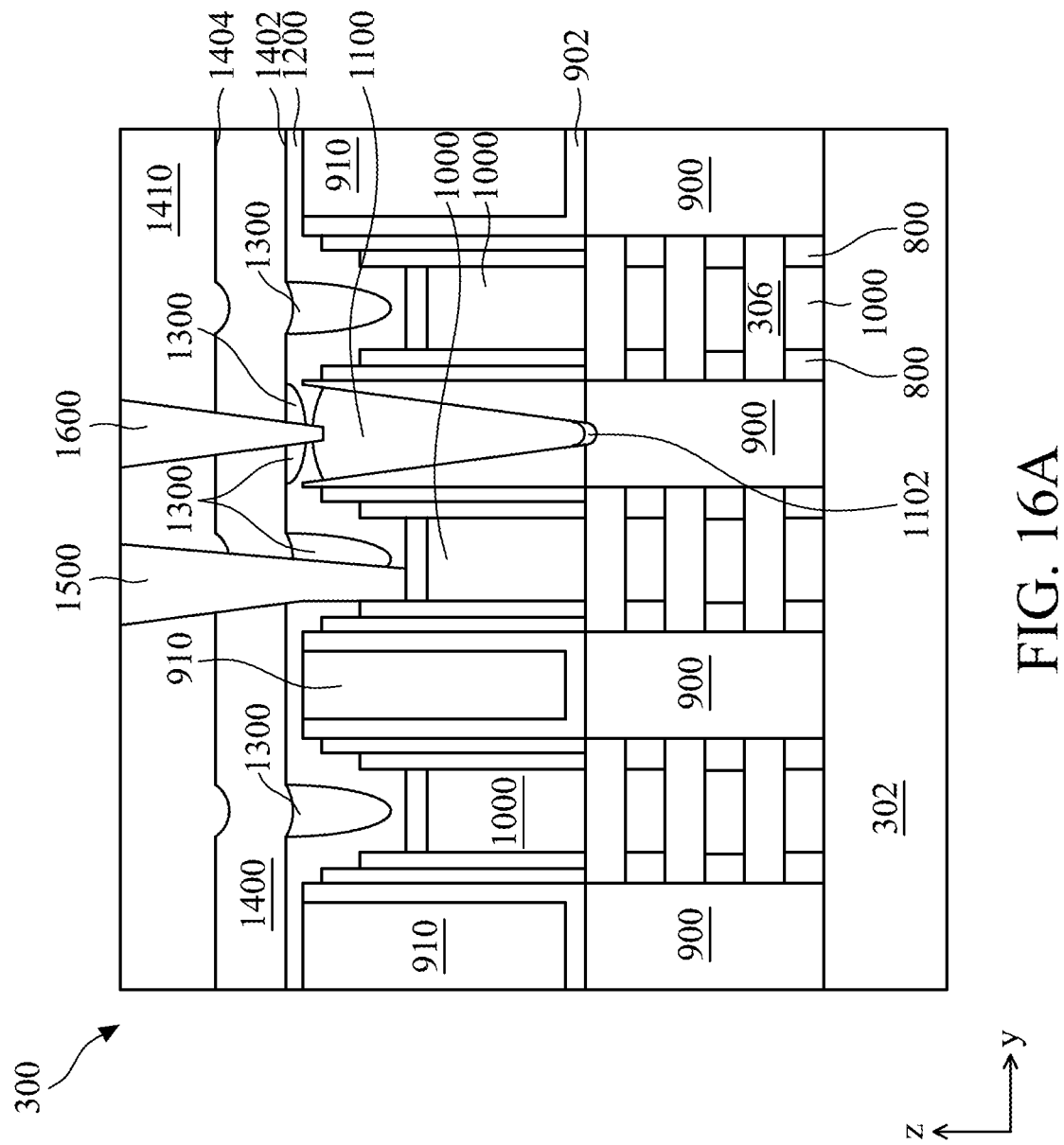
Figure 16B:
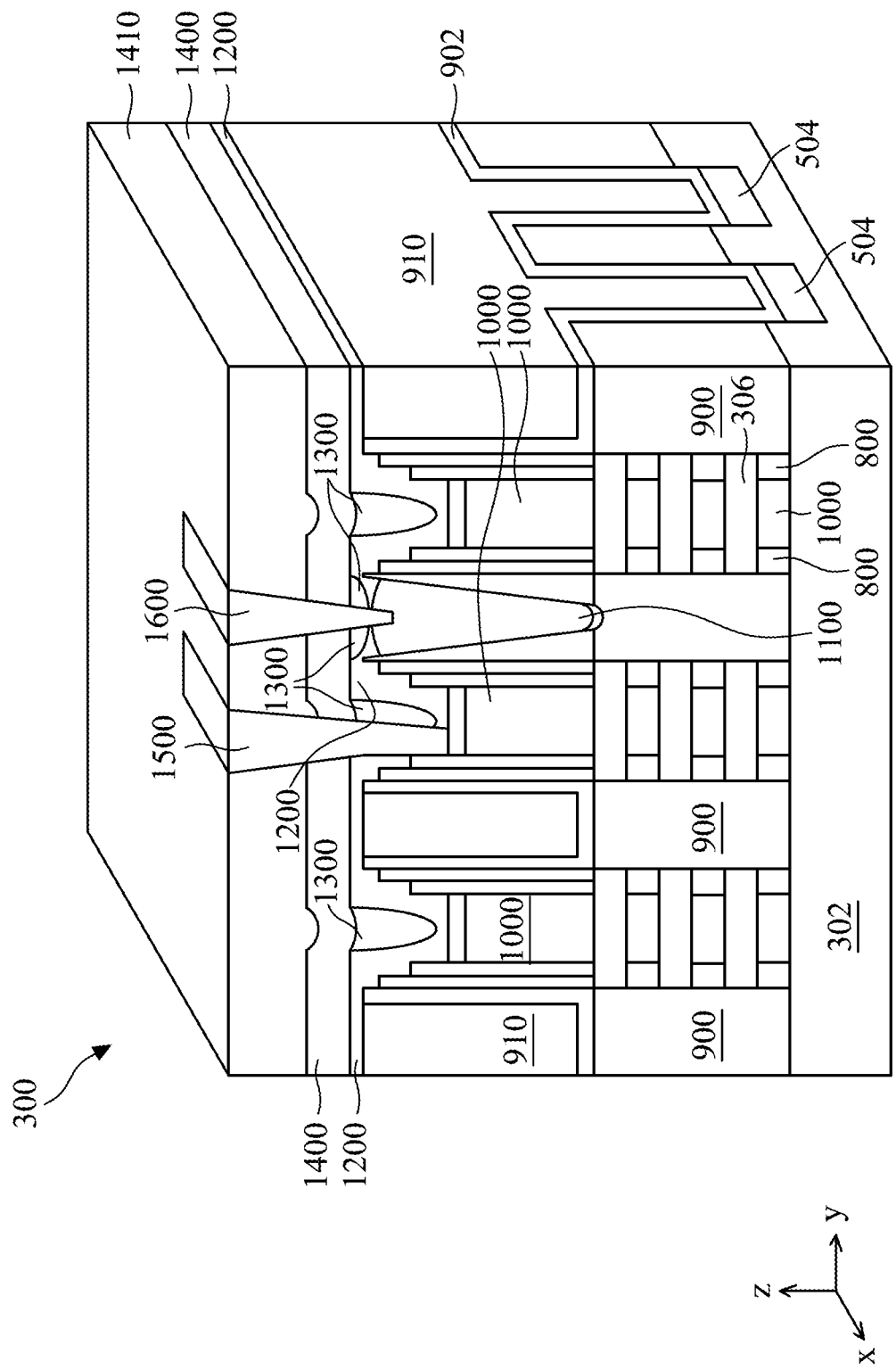

Corresponding to operation 232 of FIG. 2, FIGS. 16A-B are a cross-sectional view cut along the Y-direction and a perspective view, respectively, of the nanostructure transistor device 300 in which a third contact structure 1600 is formed.

At least one photoresist layer (also referred to as a resist layer, photosensitive layer, patterning layer, light sensitive layer, etc.) that is responsive to an exposure process for creating patterns is formed on a top surface of the transistor device. The photoresist layer may be a positive-type or negative-type resist material and may form a multi-layer structure. One example resist material is a chemical amplifier (CA) resist. Then, a photolithography process may be applied to the photoresist layer(s). The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the photoresist layer while protecting one or more other portions of the photoresist layer. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultra-violet radiation, extreme ultraviolet (EUV) radiation, and/or combinations thereof.

A recess may then be formed in the second oxide-based layer 1410, the etch stop layer 1400, the oxide-based layer 1300, and the nitride-based conformal layer 1200 through an etching process, including various dry etching, wet etching, and/or other etching methods (e.g., reactive ion etching). In some embodiments, the recess may extend and form a recess in the first contact structure 1100 to expose a top surface of the first contact structure 1100, as shown in FIG. 16A. In some embodiments, the recess is vertically sandwiched between two active gate structures 1000, as shown in FIG. 16A. In some embodiments, the recess is formed in contact vertically with the first contact structure 1100. The face of recess may be a rectangular shape, but the face of recess is not limited to a rectangular shape. In such embodiments, the width of the recess along the Y-direction may be between about 5 and about 35 nanometers, inclusive (e.g. 5, 10, 15, 20, 25, 30, and 35 nanometers). In such embodiments, the length of the recess along the X-direction may be between about 5 and about 105 nanometers, inclusive (e.g. 5, 15, 25, 35, 45, 55, 65, 75, 85, 95, and 105 nanometers). In some embodiments, the height of the recess along the Z-direction may be between about 20 and about 50 nanometers, inclusive (e.g., 20, 30, 40 and 50 nanometers).

The face of the recess may be formed in the shape of a triangle, trapezoid, circle, rectangle, or other combination of shapes thereof. In some embodiments, the angle of the sidewalls of the recess to the top surface of the ILD 910 may be between about 85 and about 90 degrees, inclusive (e.g. 85, 86, 87, 88, 89, and 90 degrees). The top surface of the first contact structure 1100 is shown to be exposed in FIG. 16A, but it is understood that the recess may be formed to expose the top surface of any first contact structure. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$, $C_4F_6$, $C_4F_8$), chlorine-containing gas (e.g., $C_{12}$, and/or $BCl_3$), bromine-containing gas (e.g., HBr), other suitable gases and/or plasmas, or combinations thereof. After the etching process, the remaining photoresist layer(s) are removed by any suitable process, including a photoresist stripping process. It is understood that multiple photoresist layers may be simultaneously or independently removed.

The third contact structure 1600 (sometimes referred to as a third interconnect structure) may be formed by filling the recess with a metal material, followed by a CMP process to remove any insulation materials. In some embodiments, the third contact structure 1600 is the same shape as the recess. The metal material may include tungsten (W), formed by a suitable method, such as PVD, CVD, electroplating, electroless plating, or the like. Besides tungsten, other material materials, such as copper (Cu), gold (Au), cobalt (Co), Ruthenium (Ru), combinations thereof, multi-layers thereof, alloys thereof, or the like, may also be used to form the third contact structure 1600.

The third contact structure 1600 is disposed on the top surface of the first contact structure 1100 and is electrically coupled with said surface, as shown in FIG. 16A. The third contact structure 1600 may not continuously extend along the X-direction as much as the first contact structure 1100. Alternatively stated, along the X-direction, the third contact structure 1600 may extend with a shorter length than the first contact structure 1100. Accordingly, the third contact structure 1600 can penetrate a portion of the dip of nitride-based conformal layer 1200 to reach the first contact structure, while a majority portion of the dip may still remain. It should be understood that the nanostructure transistor device 300 may include multiple third contact structures or that the third contact structure can be electrically coupled to any first contact structure. In various embodiments, the first contact structure 1100 and the third contact structure 1600 may be part of a middle-end-of-line (MEOL) interconnection network, which are sometimes referred to as "MD" and "VD," respectively.

In some embodiments, the third contact structure 1600 has a contact width with the first contact structure 1100 along the Y-direction of between about 9 and about 30 nanometers, inclusive (e.g., 9, 15, 20, 25, and 30 nanometers). In some embodiments, the third contact structure 1600 has a contact length with the first contact structure 1100 along the X-direction of between about 10 and about 100 nanometers, inclusive (e.g., 10, 20, 30, 40, 50, 60, 70, 80, 90, and 100 nanometers). In some embodiments, the third contact structure 1600 is at an angle of between about 85 and about 90 degrees to the ILD 910 (e.g., 85, 86, 87, 88, 89, and 90 degrees).

Figure 17:
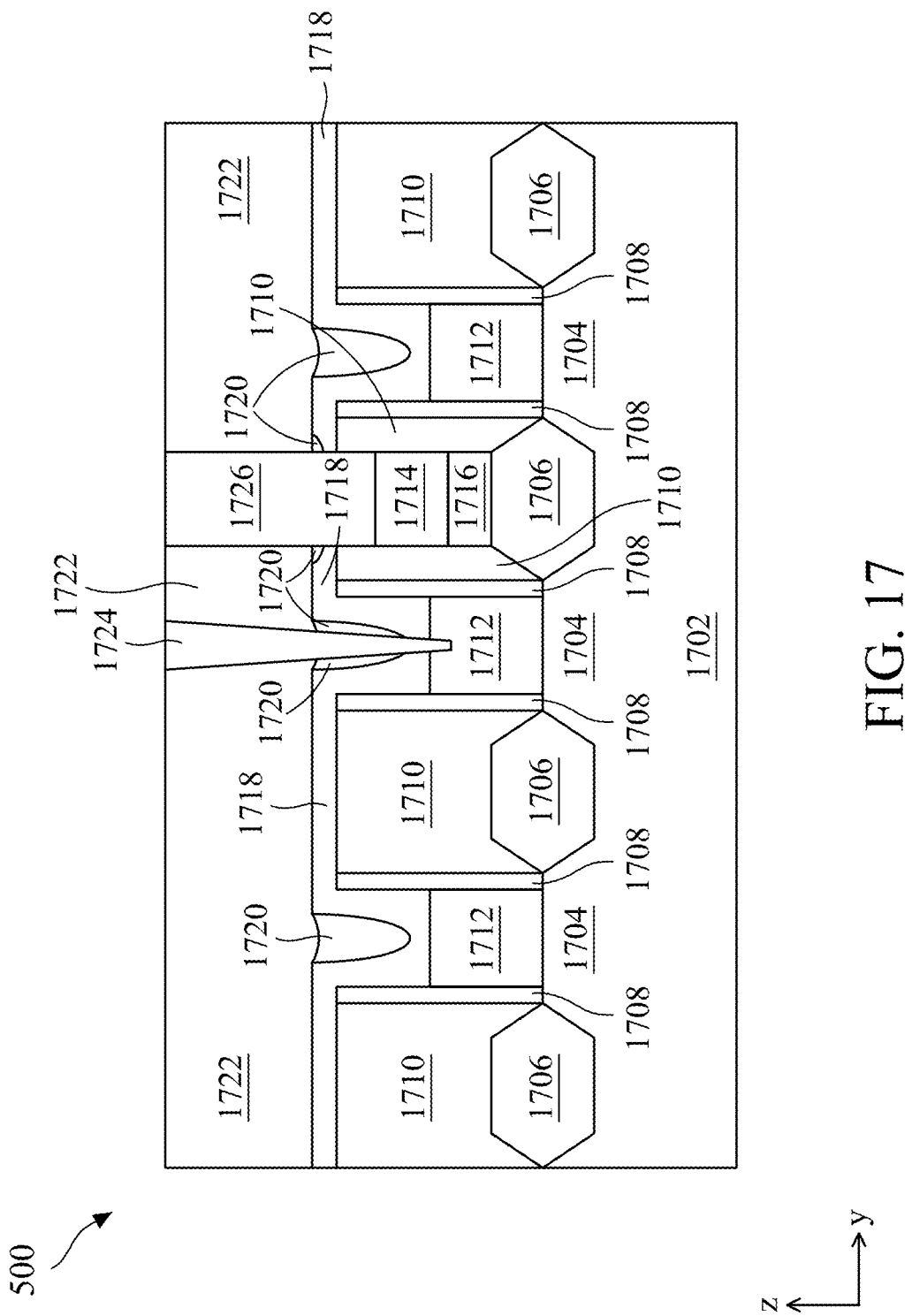
FIG. 17 illustrates a cross-sectional view of another example nanostructure transistor device (or a portion of the example nanostructure transistor device), in accordance with some embodiments.

FIG. 17 is a cross-sectional view taken along the Y-direction of a FinFET device 500 in which a nitride-based conformal layer with a dip and an oxide-based layer are formed so as to protect contact structures during formation. The FinFET device 500 is similar to the nanostructure transistor device 300 and formed by a method similar to the method 200. However, the FinFET device 500 lacks nanostructures.

The FinFET device 500 includes a FinFET substrate 1702 substantially similar to the substrate 302 and FinFET fin structures 1704 formed from patterning and etching the FinFET substrate 1702 (similar to operation 204). The FinFET fin structures 1704 may extend along the X-direction with corresponding trenches in between each FinFET fin structure 1704. FinFET isolation structures substantially similar to the isolation structures 504 may then formed in the trenches in between each FinFET structure 1704. The FinFET device 500 may then include the formation of one or more dummy gates (not shown) substantially similar to the dummy gate structures 600. The FinFET device 500 may further include FinFET epitaxial structures 1706 substantially similar to the epitaxial structures 900 and FinFET gate spacers 1708 substantially similar to the to the gate spacers 700.

The FinFET device 500 may further include a FinFET ILD 1710 substantially similar to the ILD 910. Then, the dummy gates in the FinFET 500 may be replaced with FinFET active gate structures 1712 which are substantially similar to the to the active gate structures 1000. A FinFET dielectric capping layer substantially similar to the capping layer 1010 may then be formed over the active gate structure 1712. Then, a first FinFET contact structure 1714 substantially similar to the first contact structure 1100 may be formed over one of the FinFET epitaxial structures 1706. The first FinFET contact structure 1714 may include a FinFET silicide layer 1716 substantially similar to the silicide layer 1102 and disposed in between the FinFET epitaxial structure 1706 and the first FinFET contact structure 1714. The FinFET silicide layer 1716 may be optional. Then, the FinFET dielectric capping layer may be removed.

The FinFET device 500 may further include a FinFET nitride-based conformal layer 1718 substantially similar to the nitride-based conformal layer 1200. The FinFET nitride-based conformal layer 1718 may be disposed above the FinFET active gate structures 1712, the FinFET gate spacers 1708, the FinFET ILD 1710, and the first FinFET contact structure 1714. The FinFET nitride-based conformal layer 1718 may have a dip over the FinFET active gate structures 1712 and/or the first FinFET contact structure 1714. The FinFET device 500 may further include a FinFET oxide-based layer 1720 substantially similar to the oxide-based layer 1300 formed over the FinFET nitride-based conformal layer 1718. The FinFET oxide-based layer 1720 is also formed due to the larger capacitance of the FinFET nitride-based conformal layer 1718 in comparison to the previously formed dielectric capping layer. The FinFET oxide-based layer 1720 may be disposed above the FinFET active gate structures 1712 and the first FinFET contact structure 1714.

The FinFET device 500 may further include a second FinFET oxide-based layer 1722 substantially similar to the second oxide-based layer 1410. A bottom surface of the second FinFET oxide-based layer 1722 may also include dips above portions of the FinFET nitride-based conformal layer 1718 that contain dips. In some embodiments, a second FinFET contact structure 1724 substantially similar to the second contact structure 1500 may be formed over one of the FinFET active gate structures 1712. In some embodiments, a third FinFET contact structure 1726 substantially similar to the third contact structure 1600 may be formed over the first FinFET contact structure 1714.

It is understood that other components of the FinFET device 500 such as contact etch stop layers, other gate spacers, inductors, fuses, capacitors, coils, etc. may be included in the device but are not shown for the purposes of clarity of illustration. Therefore, the nitride-based conformal layer and the oxide-based layer is not limited to nanostructure transistor devices and can be formed in any suitable semiconductor device with other transistor configurations such as, but not limited to, FinFET transistor devices.

In one aspect of the present disclosure, a semiconductor device is disclosed. The semiconductor device includes a channel structure, a first gate structure straddling the channel structure, and an epitaxial structure. The epitaxial structure is adjacent to the first gate structure and is coupled to an end of the channel structure. The semiconductor device further includes a first contact structure disposed over and in contact with the epitaxial structure and a nitride-based conformal layer extending at least over the first contact structure. The semiconductor device further includes an oxide-based layer disposed over the nitride-based conformal layer. A portion of the nitride-based conformal layer, disposed over the first contact structure, has a dip that is filled with a first portion of the oxide-based layer.

In another aspect of the present disclosure, a semiconductor device is disclosed. The semiconductor device includes a channel structure and a first gate structure straddling the channel structure. The semiconductor device further includes a first source/drain structure that is adjacent to the first gate structure and is coupled to an end of the channel structure. The semiconductor device further includes a first contact structure disposed over and in contact with the source/drain structure. The semiconductor device further includes a gate spacer disposed between the first gate structure and the first contact structure. The semiconductor device further includes an oxide-based layer disposed over the nitride-based conformal layer. The semiconductor device further includes a second contact structure that penetrates through a first portion of the oxide-based layer and the nitride-based conformal layer to be in contact with the first gate structure.

In yet another aspect of the present disclosure, a method for making a semiconductor device is disclosed. The method includes forming a semiconductor device that at least includes a gate structure straddling a channel structure and a first epitaxial structure adjacent to the gate structure. The first epitaxial structure is overlaid by an interlayer dielectric. The method further includes forming a nitride-based conformal layer that extends over the gate structure and the interlayer dielectric. The method further includes forming an oxide-based layer over the nitride-based layer, wherein the oxide-based layer includes a first portion that fills up a recess above the gate structure. The method further includes forming a first contact structure that extends through the first portion of the oxide-based layer and the nitride-based conformal layer to couple to the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a channel structure;
   a first gate structure straddling the channel structure;
   an epitaxial structure, adjacent the first gate structure, that is coupled to an end of the channel structure;
   a first contact structure disposed over and in contact with the epitaxial structure;
   a nitride-based conformal layer extending at least over the first contact structure; and
   an oxide-based layer disposed over the nitride-based conformal layer;
   wherein a first portion of the nitride-based conformal layer, disposed over the first contact structure, has a dip that is filled with a first portion of the oxide-based layer, and
   wherein a second portion of the nitride-based conformal layer, extending continuously from the first portion of the nitride-based conformal layer, is disposed over a top surface of the first gate structure.

2. The semiconductor device of claim 1, further comprising a second contact structure disposed over the first gate structure, wherein the second contact structure penetrates through a second portion of the oxide-based layer and the second portion of the nitride-based conformal layer to be in contact with the first gate structure.

3. The semiconductor device of claim 2, further comprising a gate spacer interposed between the first contact structure and the first gate structure, wherein the second contact structure and the nitride-based conformal layer directly contact the first gate spacer.

4. The semiconductor device of claim 2, further comprising a gate spacer interposed between the first contact structure and the first gate structure, wherein the second contact structure is separated apart from the gate spacer with the nitride-based conformal layer and the second portion of the oxide-based layer.

5. The semiconductor device of claim 2, further comprising a third contact structure disposed over the first contact structure, wherein the third contact structure penetrates through the first portion of the oxide-based layer and the nitride-based conformal layer to be in contact with the first contact structure.

6. The semiconductor device of claim 5, further comprising an etch stop layer disposed over the oxide-based layer and the nitride-based conformal layer, wherein the second and third contact structures further penetrate through the etch stop layer, respectively.

7. The semiconductor device of claim 6, wherein the etch stop layer has a top surface and a bottom surface, and wherein a portion of the top surface and a portion of the bottom surface that are disposed above a second gate structure each have a dip.

8. The semiconductor device of claim 1, wherein the channel structure includes a plurality of nanostructures vertically spaced apart from one another.

9. The semiconductor device of claim 8, wherein the first gate structure wraps around each of the plurality of nanostructures.

10. The semiconductor device of claim 1, wherein the channel structure contains a fin structure that is integrally formed from a substrate.

11. A semiconductor device, comprising:
    a channel structure;
    a first gate structure straddling the channel structure;
    a source/drain structure, adjacent the first gate structure, that is coupled to an end of the channel structure;
    a first contact structure disposed over and in contact with the source/drain structure;
    a gate spacer disposed between the first gate structure and the first contact structure;
    a nitride-based conformal layer extending over the first contact structure, the gate spacer, and at least a portion of the first gate structure;
    an oxide-based layer disposed over the nitride-based conformal layer; and
    a second contact structure that penetrates through a first portion of the oxide-based layer and the nitride-based conformal layer to be in contact with the first gate structure, wherein the first portion of the oxide-based layer extends to below a top surface the nitride-based conformal layer.

12. The semiconductor device of claim 11, wherein a portion of the nitride-based conformal layer, disposed over the first contact structure, has a dip that is filled with a second portion of the oxide-based layer.

13. The semiconductor device of claim 11, further comprising an etch stop layer disposed over the oxide-based layer and the nitride-based conformal layer, wherein the second contact structure further penetrates through the etch stop layer.

14. The semiconductor device of claim 13, wherein the etch stop layer has a top surface and a bottom surface, and wherein a portion of the top surface and a portion of the bottom surface that are disposed above a second gate structure each have a dip.

15. The semiconductor device of claim 14, wherein the nitride-based conformal layer also extends over the second gate structure.

16. The semiconductor device of claim 11, wherein the channel structure includes a plurality of nanostructures vertically spaced apart from one another.

17. The semiconductor device of claim 16, wherein the first gate structure wraps around each of the plurality of nanostructures.

18. A method for making semiconductor devices, comprising:
- forming a semiconductor device that at least includes a gate structure straddling a channel structure and a first epitaxial structure adjacent the gate structure, wherein the first epitaxial structure is overlaid by an interlayer dielectric;
- forming a nitride-based conformal layer that extends over the gate structure and the interlayer dielectric;
- forming an oxide-based layer over the nitride-based conformal layer, wherein the oxide-based layer includes a first portion that fills up a recess above the gate structure; and
- forming a first contact structure that extends through the first portion of the oxide-based layer and the nitride-based conformal layer to couple to the gate structure.

19. The method of claim 18, further comprising forming an etch stop layer over the oxide-based layer, wherein the first contact structure further extends through the etch stop layer.

20. The method of claim 18, wherein the semiconductor device further includes a second epitaxial structure opposite the gate structure from the first epitaxial structure, the method further comprises:
- prior to the step of forming the nitride-based conformal layer, forming a second contact structure coupled to the second epitaxial structure, wherein a portion of nitride-based layer, disposed over the second contact structure, has a dip that is filled with a second portion of the oxide-based layer.

* * * * *